US010784350B2

(12) United States Patent
Hayashida et al.

(10) Patent No.: US 10,784,350 B2
(45) Date of Patent: Sep. 22, 2020

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventors: Tetsuro Hayashida, Tokyo (JP); Takuma Nanjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/078,295

(22) PCT Filed: Mar. 8, 2017

(86) PCT No.: PCT/JP2017/009253
§ 371 (c)(1),
(2) Date: Aug. 21, 2018

(87) PCT Pub. No.: WO2017/163881
PCT Pub. Date: Sep. 28, 2017

(65) Prior Publication Data
US 2019/0058040 A1 Feb. 21, 2019

(30) Foreign Application Priority Data
Mar. 23, 2016 (JP) ................... 2016-057997

(51) Int. Cl.
*H01L 29/06* (2006.01)
*H01L 29/36* (2006.01)
(Continued)

(52) U.S. Cl.
CPC ...... *H01L 29/2003* (2013.01); *H01L 21/0254* (2013.01); *H01L 21/02636* (2013.01);
(Continued)

(58) Field of Classification Search
CPC ........... H01L 29/2003; H01L 29/66522; H01L 29/66212; H01L 29/517; H01L 29/513;
(Continued)

(56) References Cited

U.S. PATENT DOCUMENTS 7,227,189 B2 * 6/2007 Biwa ...................... C30B 25/02
117/106
2003/0098462 A1 5/2003 Yoshida
(Continued)

FOREIGN PATENT DOCUMENTS

FR 3 011 385 A1 4/2015
JP 2003-229566 A 8/2003
(Continued)

OTHER PUBLICATIONS

International Search Report dated May 30, 2017 in PCT/JP2017/009253 filed Mar. 8, 2017.
(Continued)

*Primary Examiner* — Natalia A Gondarenko
(74) *Attorney, Agent, or Firm* — Xsensus LLP

(57) ABSTRACT

A first insulating layer is disposed on a second surface of a semiconductor substrate, and has an opening. A second insulating layer is disposed on the second surface and separated from the first insulating layer. A stack includes, in sequence on the second surface, a side n-type epitaxial layer and first and second p-type epitaxial layers that are made of a gallium-nitride-based material. The stack has an outer side wall having a portion formed of the second p-type epitaxial layer, an inner side wall extending from the second insulating layer, and a top surface. The n-type contact layer is disposed on the top surface. The source electrode portion is in contact with the n-type contact layer on the top surface,
(Continued)

and is in contact with the second p-type epitaxial layer on the outer side wall. A gate insulating film is disposed on the inner side wall.

5 Claims, 30 Drawing Sheets

(51) Int. Cl.
| H01L 29/08 | (2006.01) |
| H01L 29/78 | (2006.01) |
| H01L 29/66 | (2006.01) |
| H01L 29/51 | (2006.01) |
| H01L 29/417 | (2006.01) |
| H01L 29/423 | (2006.01) |
| H01L 29/20 | (2006.01) |
| H01L 29/40 | (2006.01) |
| H01L 29/872 | (2006.01) |
| H01L 29/861 | (2006.01) |
| H01L 29/868 | (2006.01) |
| H01L 29/12 | (2006.01) |
| H01L 21/02 | (2006.01) |
| H01L 21/265 | (2006.01) |
| H01L 21/28 | (2006.01) |
| H01L 21/306 | (2006.01) |
| H01L 29/10 | (2006.01) |

(52) U.S. Cl.
CPC .. *H01L 21/26546* (2013.01); *H01L 21/28264* (2013.01); *H01L 21/30625* (2013.01); *H01L 29/06* (2013.01); *H01L 29/0649* (2013.01); *H01L 29/0692* (2013.01); *H01L 29/0847* (2013.01); *H01L 29/12* (2013.01); *H01L 29/36* (2013.01); *H01L 29/41758* (2013.01); *H01L 29/4236* (2013.01); *H01L 29/42364* (2013.01); *H01L 29/42376* (2013.01); *H01L 29/513* (2013.01); *H01L 29/517* (2013.01); *H01L 29/66212* (2013.01); *H01L 29/66522* (2013.01); *H01L 29/78* (2013.01); *H01L 29/861* (2013.01); *H01L 29/868* (2013.01); *H01L 29/872* (2013.01); *H01L 29/1095* (2013.01)

(58) Field of Classification Search
CPC ......... H01L 29/42376; H01L 29/42364; H01L 29/4236; H01L 29/41758; H01L 29/36; H01L 29/0847; H01L 29/0692; H01L 29/0649; H01L 29/872; H01L 29/78; H01L 29/1095; H01L 29/12; H01L 29/06; H01L 29/868; H01L 29/861; H01L 21/30625; H01L 21/28264; H01L 21/26546; H01L 21/02636; H01L 21/0254
USPC .......................... 257/76, 103, 78, 200, 201
See application file for complete search history.

(56) References Cited

U.S. PATENT DOCUMENTS

| 2009/0179258 | A1 | 7/2009 | Otake |
| 2010/0159656 | A1* | 6/2010 | Nakata ................ H01L 29/7787 438/268 |
| 2013/0306983 | A1 | 11/2013 | Nakano et al. |
| 2018/0012974 | A1* | 1/2018 | Nakano .................. H01L 29/12 |

FOREIGN PATENT DOCUMENTS

| JP | 2007-214515 A | 8/2007 |
| JP | 2009-177110 A | 8/2009 |
| JP | 2012-178536 A | 9/2012 |
| JP | 2014-192174 A | 10/2014 |

OTHER PUBLICATIONS

Hiramatsu, K. et al., "Fabrication and characterization of low defect density GaN using facet-controlled epitaxial lateral overgrowth (FACELO)", Journal of Crystal Growth, vol. 221 (2000), pp. 316-326.

* cited by examiner

F I G. 5
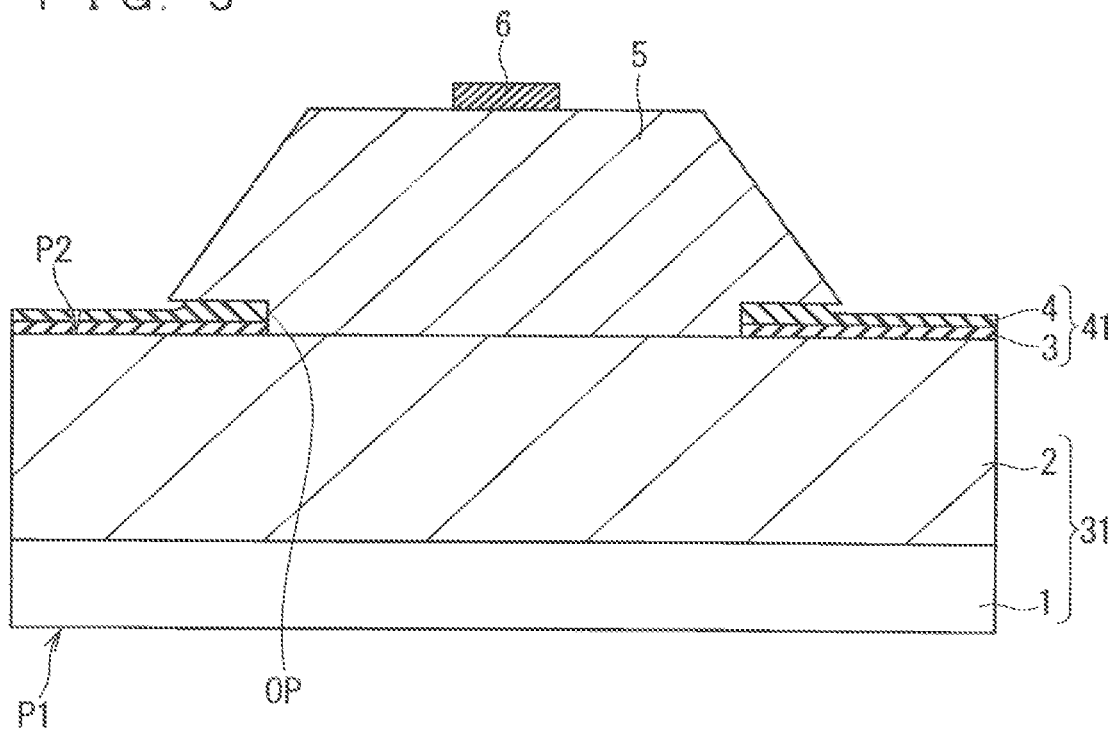
F I G. 6
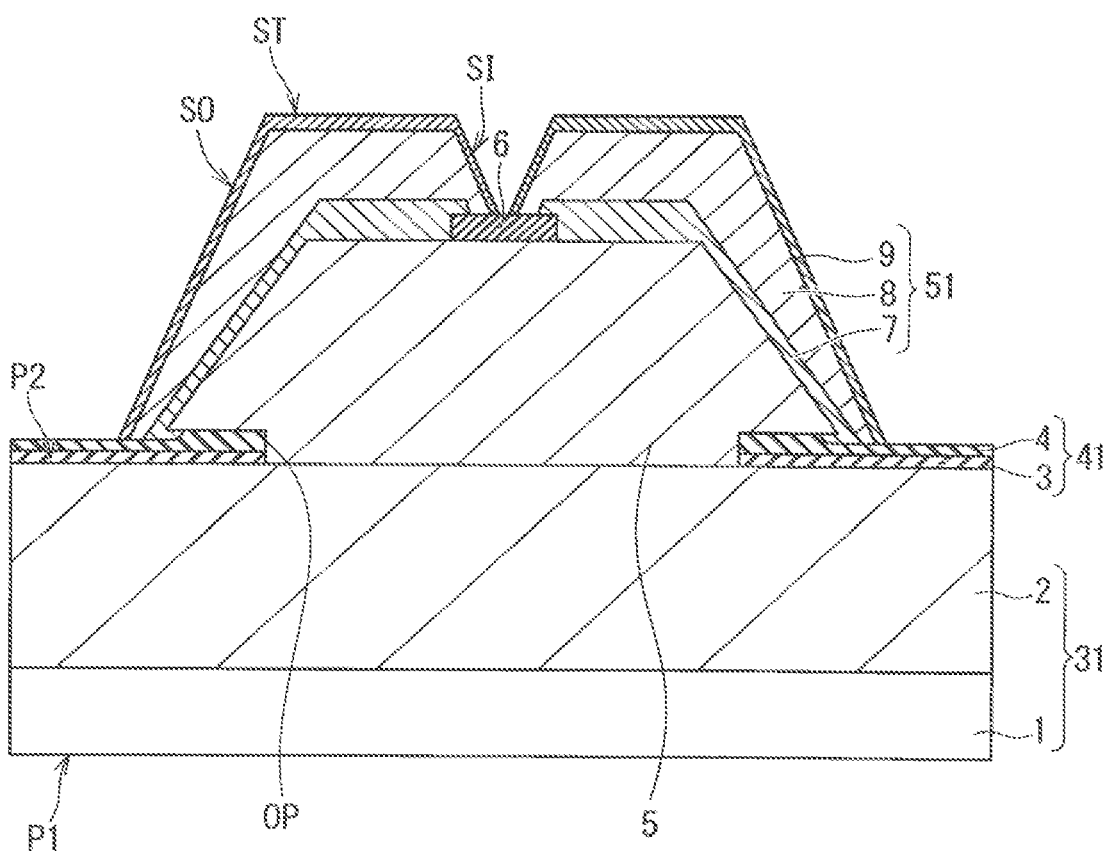

F I G. 10
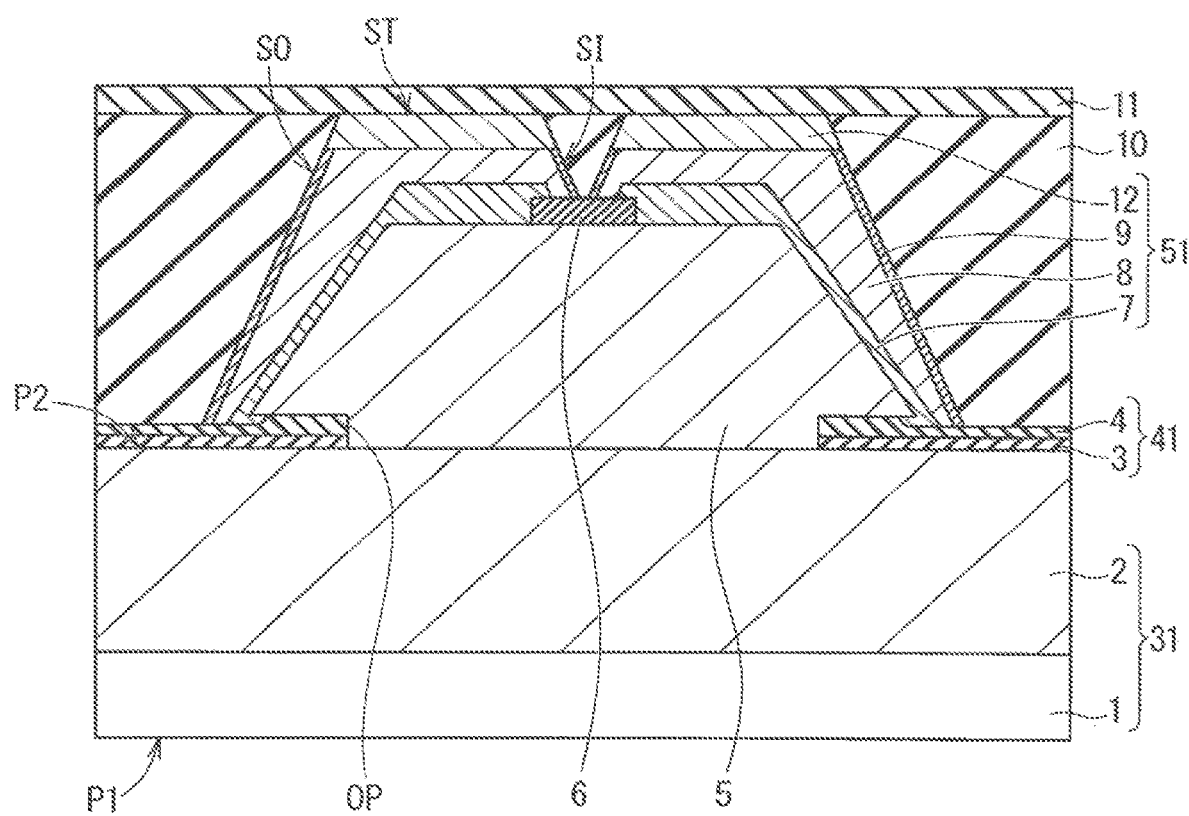

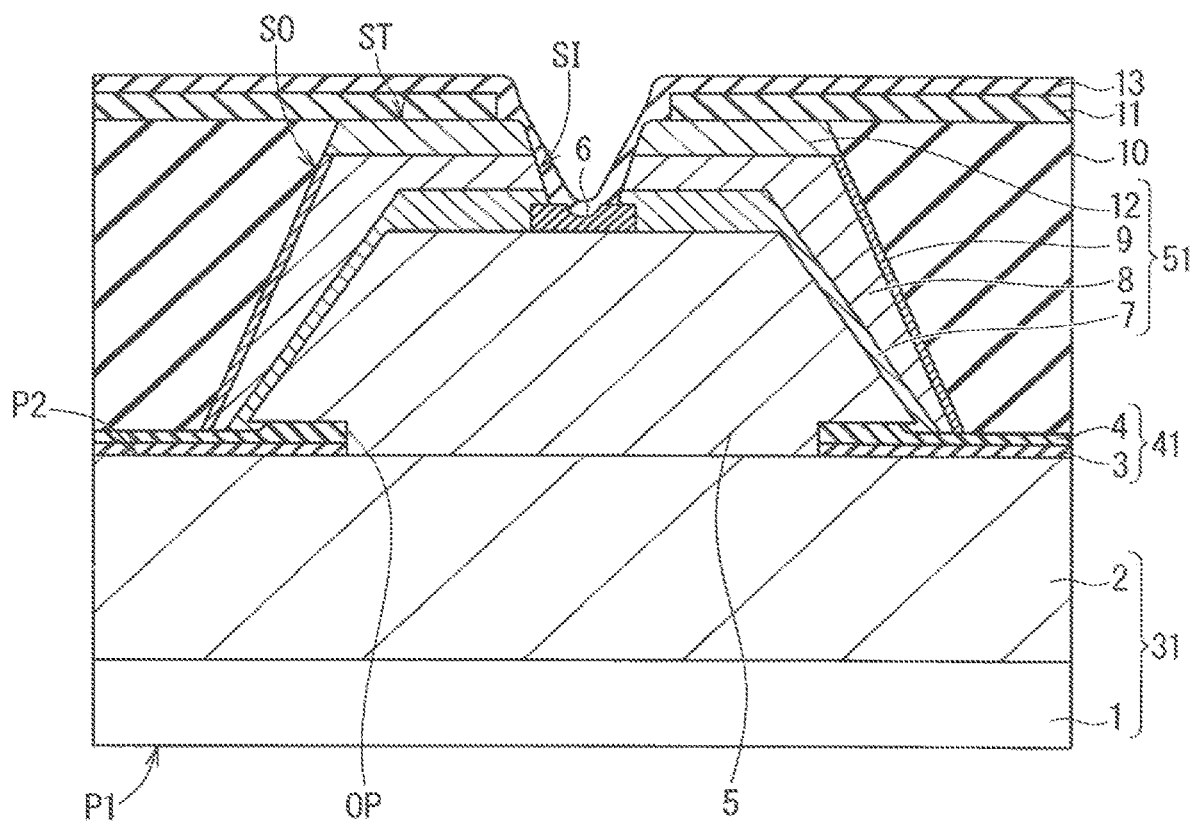
F I G. 1 4

SEMICONDUCTOR DEVICE AND METHOD FOR MANUFACTURING SEMICONDUCTOR DEVICE

TECHNICAL FIELD

The present invention relates to semiconductor devices and methods for manufacturing the semiconductor devices, and more particularly, to a semiconductor device made of a gallium-nitride-based material and a method for manufacturing the semiconductor device.

BACKGROUND ART

Semiconductor devices including wide bandgap semiconductors have been actively developed in recent years. One of the wide bandgap semiconductors particularly with hope is a gallium-nitride (GaN)-based material. Hence, techniques relating to the GaN-based material such as a technique of epitaxial layer formation and a microprocessing technique of processing an epitaxial layer into a desired shape have been studied.

Non-Patent Document 1 studies a selective growth technique of growing an epitaxial layer into a desired shape with application to optical semiconductor devices, such as a laser and an ultraviolet detector in view. The GaN-based material is promisingly available to power semiconductor devices other than the optical semiconductor devices. In a method for manufacturing the power semiconductor device, the epitaxial layer, after grown, typically undergoes etching for providing a desired shape as necessary. Particularly in the manufacturing of a trench-gate-structured Metal Oxide Semiconductor Field Effect Transistor (MOSFET), which has been actively studied in recent years, a trench is formed in the epitaxial layer through dry-etching after the epitaxial layer is formed. The trench-gate MOSFET commonly has a vertical structure in which a high voltage is applied in a vertical direction (a depth direction of the trench). An electric field is apt to concentrate at the bottom of the trench in this case. This likely causes a reduction in withstand voltage. Hence, to achieve the reliability of the semiconductor device, such a concentration of the electric field at the bottom of the trench needs to be lessened.

In Patent Document 1, provided is a dual structure consisting of an inner trench and an outer trench. The inner trench has a trench-gate structure. The outer trench has a p-type region formed through ion implantation. In particular, the bottom of the outer trench has a p+ region of a high impurity concentration as a contact region. In an off-state, a depletion layer extends from the side surface of the outer trench formed by the p-type region. This lessens an electric field applied to a gate oxide film disposed on the bottom of the inner trench with a trench-gate structure. Consequently, an electrical breakdown in the off-state is prevented. As a result, the withstand voltage improves.

In Patent Document 2, a p-type GaN layer is formed on an n-type GaN layer through crystal growth without the use of ion implantation. Then, etching is performed to form a recess penetrating the n-type GaN layer to reach the p-type GaN layer. Disposed in the recess is a source electrode. In a semiconductor device as obtained, a depletion layer extending from the p-type GaN layer lessens the concentration of an electric field in a trench portion.

To achieve the reliability of the MOSFET, an avalanche breakdown needs to be suppressed. An n-channel MOSFET has an n-type source, a p-type body, and an n-type drain as semiconductor regions. The MOSFET includes a parasitic bipolar transistor in which the n-type source, the p-type body, and the n-type drain respectively serve as an emitter, a base, and a collector. An ionizing collision generates electron-hole pairs in a drift layer when electric field strength at an electric-field concentration point in the MOSFET exceeds avalanche electric-field strength. The hole is stored in the p-type body having a low potential. The potential of the p-type body thus rises. This causes a reduction in barrier of a pn junction. More electrons are consequently injected to the p-type body. This causes a further ionizing collision. Such a phenomenon destroys the semiconductor device in the end. To avoid this avalanche breakdown, the holes need to be efficiently withdrawn from the p-type body so that the potential of the p-type body does not excessively rise. Accordingly, an electrode for hole withdrawal needs to be connected to the p-type body at a low resistance.

In Patent Document 3, a p-type body region partly undergoes ion implantation to form an n-type source region. The n-type source region and the p-type body region are respectively provided with a source electrode and a body electrode. The body electrode is made of a material that is particularly suitable for electrical contact with p-type GaN (not n-type GaN). As a result, relatively favorable ohmic contact is established between the p-type body region having a relatively low impurity concentration and the body electrode. The body electrode and the source electrode are electrically connected to each other, thereby enabling the holes to be relatively efficiently withdrawn from the p-type body region.

PRIOR ART DOCUMENTS

Patent Documents

Patent Document 1: Japanese Patent Application Laid-Open No. 2012-178536
Patent Document 2: Japanese Patent Application Laid-Open No. 2014-192174
Patent Document 3: Japanese Patent Application Laid-Open No. 2009-177110

Non-Patent Document

Non-Patent Document 1: Kazumasa Hiramatsu et al. "Fabrication and characterization of low defect density GaN using facet-controlled epitaxial lateral overgrowth (FACELO)", Journal of Crystal Growth, Volume 221 (2000) pp. 316-326

SUMMARY

Problem to be Solved by the Invention

In the technique of Patent Document 1, the p-type region and the p+ region are formed through ion implantation. This step is easy for a silicon carbide (SiC) material, but is difficult for the gallium-nitride (GaN)-based material because p-type GaN is quite vulnerable to process damage. To be specific, a defect in the ion implantation acts as a donor, thereby compensating an acceptor added through ion implantation. Hence, the formation of the p-type region through ion implantation is commonly difficult. The formation of the p+ region through ion implantation is extremely difficult in particular. The technique of Patent Document 1 is thus unsuitable for the GaN-based material serving as a semiconductor material. Further, in the technique of Patent Document 1, a resist mask defines a position for forming the p+ region. Hence, the bottom of the trench needs to have a large area to a certain degree in order to allocate a positioning margin in photolithography for forming the resist mask. As a result, it is difficult for the n-type source region to have a large area per unit area of the MOSFET. The MOSFET is thus apt to have a large on-resistance.

In the technique of Patent Document 2, the dry-etching for the recess formation produces a crystal defect acting as an n-type impurity (donor) in the p-type GaN layer. A compensation effect of carriers resulting from the crystal defect causes a considerable reduction in effective p-type carrier concentration. Hence, the dry-etching alone cannot establish ohmic contact with the p-type GaN layer. Accordingly, it can be considered to perform a process to remove a site with a crystal defect through wet-etching. Unfortunately, this process is extremely difficult to control. A potassium hydroxide (KOH) solution used in GaN wet-etching has a considerably high etch rate with respect to a site with a crystal defect, such as a dislocation or a layer damaged by etching. Hence, etching progress is difficult to stop within the p-type GaN layer having a small thickness only enough to correspond to a channel length when a substrate has a high dislocation density. The etching probably progress to reach an n-type drift layer under the p-type GaN layer. The source electrode formed afterwards is short-circuited with a drain electrode through the n-type drift layer in this case. A sufficient manufacture yield is thus unpromising. Moreover, GaN having a p-type is easily terminated by hydrogen, and consequently becomes inactive. To activate the p-type GaN layer, annealing for hydrogen removal is required. Unfortunately, the n-type GaN layer stacked on the p-type GaN layer can hinder hydrogen from detaching from the p-type GaN layer in the structure of Patent Document 2. This possibly results in insufficient activation of the p-type GaN layer.

In the technique of Patent Document 3, the body electrode needs to be provided separately from the source electrode, and further needs to be electrically connected to the source electrode. This produces complicated manufacture steps. Moreover, even if a material as the body electrode suitable to the p-type GaN is selected, it is difficult to achieve favorable ohmic contact with the p-type body region, which has a relatively low impurity concentration. The impurity concentration of the p-type body region needs to be set in conformance with channel characteristics. Hence, the p-type body region cannot have a high impurity concentration only in view of the resistance of contact with the body electrode. Further, if the p-type body region were allowed to have a high impurity concentration in view of the channel characteristics, such a high impurity concentration of the p-type body region would have an unfavorable effect on the characteristics of the n-type source region formed through ion implantation into the p-type body region. The high impurity concentration of the p-type body would require a high doping concentration in the ion implantation in order to increase an effective impurity concentration of the n-type source region. This would result in unfavorable effects, such as imparity scattering and implantation damage within the n-type source region, thereby increasing the resistance of the n-type source region. Consequently, the MOSFET would have a large on-resistance. For this reason, the p-type body region has no choice but to have a relatively low impurity concentration. As such, the technique of Patent Document 3 may not prevent the avalanche breakdown sufficiently.

The foregoing details the reliability achievement of the MOSFET made of the GaN-based material. Establishing contact between an electrode and a p-type semiconductor region at a low resistance can be an important technique to achieve a reliable GaN-based diode in view of reverse withstand voltage, which will be detailed later on.

The present invention has been made to solve these problems. It is an object of the present invention to provide a gate-electrode-structured semiconductor device capable of improving avalanche strength, and a method for manufacturing the semiconductor device. It is another object of the present invention to provide a semiconductor device including an anode electrode and a cathode electrode, the semiconductor device being capable of enhancing reverse withstand voltage, and to provide a method for manufacturing the semiconductor device.

Means to Solve the Problem

A semiconductor device according to one aspect of the present invention includes a semiconductor substrate, a first insulating layer, a second insulating layer, a stack, an n-type contact layer, a source electrode portion, a drain electrode, a gate insulating film, and a gate electrode. The semiconductor substrate has a first surface and a second surface opposite the first surface. The first insulating layer is disposed on the second surface of the semiconductor substrate, and has an opening partly exposing the second surface. The second insulating layer is disposed on the second surface of the semiconductor substrate, and separated from the first insulating layer. The stack includes, in sequence on the second surface of the semiconductor substrate, a side n-type epitaxial layer, a first p-type epitaxial layer having a first impurity concentration, and a second p-type epitaxial layer having an impurity concentration higher than the first impurity concentration. The side n-type epitaxial layer, the first p-type epitaxial layer, and the second p-type epitaxial layer are made of a gallium-nitride-based material. The stack has an outer side wall, an inner side wall, and a top surface joining the outer side wall and the inner side wall together, the outer side wall having a portion that is formed of the second p-type epitaxial layer, extending from the first insulating layer, and forming a smaller angle than a right angle together with the second surface of the semiconductor substrate, the inner side wall having a portion that is formed of the first p-type epitaxial layer, and extending from the second insulating layer. The n-type contact layer is disposed on the top surface of the stack, and is in contact with the first p-type epitaxial layer. The source electrode portion is in contact with the n-type contact layer on the top surface of the stack, and is in contact with the second p-type epitaxial layer on the outer side wall of the stack. The drain electrode is disposed on the first surface. The gate insulating film is disposed on the inner side wall of the stack. The gate electrode is disposed on the gate insulating film.

A semiconductor device according to another aspect of the present invention includes a semiconductor substrate, an insulating layer, a stack, an n-type barrier layer, an anode electrode, and a cathode electrode. The semiconductor substrate has a first surface and a second surface opposite the first surface. The insulating layer is disposed on the second surface of the semiconductor substrate, and has an opening partly exposing the second surface. The stack includes an n-type epitaxial layer and a p-type epitaxial layer in sequence on the second surface of the semiconductor substrate. The n-type epitaxial layer and the p-type epitaxial layer are made of a gallium-nitride-based material. The stack has a side wall extending from the insulating layer and forming a smaller angle than a right angle together with the second surface of the semiconductor substrate, and a top surface joined to the side wall. The n-type barrier layer is partly disposed on the top surface of the stack, and is in contact with the n-type epitaxial layer. The anode electrode is in contact with the p-type epitaxial layer and the n-type barrier layer on the top surface of the stack, and is in contact with the p-type epitaxial layer on the side wall of the stack. The cathode electrode is disposed on the first surface.

A method for manufacturing the semiconductor device according to the one aspect of the present invention includes the following steps. A semiconductor substrate having a first surface and a second surface is prepared. A first insulating layer having an opening partly exposing the second surface is formed on the second surface of the semiconductor substrate. A second insulating layer separated from the first insulating layer is formed on the second surface of the semiconductor substrate. A side n-type epitaxial layer, a first p-type epitaxial layer having a first impurity concentration, and a second p-type epitaxial layer having an impurity concentration higher than the first impurity concentration are deposited in sequence through selective epitaxial-growth of a gallium-nitride-based material on the second surface of the semiconductor substrate using the first insulating layer and the second insulating layer as growth masks to form a stack having an outer side wall extending from the first insulating layer and forming a smaller angle than a right angle together with the second surface of the semiconductor substrate, an inner side wall extending from the second insulating layer, and a top surface joining the outer side wall and the inner side wall together. An n-type contact layer in contact with the first p-type epitaxial layer is formed on the top surface of the stack. A source electrode portion being in contact with the n-type contact layer on the top surface of the stack, and being in contact with the second p-type epitaxial layer on the outer side wall of the stack is formed. A drain electrode is formed on the first surface. A gate insulating film is formed on the inner side wall of the stack. A gate electrode is formed on the gate insulating film.

A method for manufacturing the semiconductor device according to the other aspect of the present invention includes the following steps. A semiconductor substrate having a first surface and a second surface is prepared. An insulating layer having an opening partly exposing the second surface is formed on the second surface of the semiconductor substrate. An n-type epitaxial layer and a p-type epitaxial layer are deposited in sequence through selective epitaxial-growth of a gallium-nitride-based material on the second surface of the semiconductor substrate using the first insulating layer as a growth mask to form a stack having a side wall extending from the insulating layer and forming a smaller angle than a right angle together with the second surface of the semiconductor substrate, and a top surface joined to the side wall. An n-type barrier layer in contact with the n-type epitaxial layer is formed partly onto the top surface of the stack. An anode electrode being in contact with the p-type epitaxial layer and the n-type barrier layer on the top surface of the stack, and being in contact with the p-type epitaxial layer on the side wall of the stack is formed. A cathode electrode is formed on the first surface.

Effects of the Invention

According to the one aspect of the present invention, the second p-type epitaxial layer is not an implanted layer formed through ion implantation, but an epitaxial layer. The second p-type epitaxial layer thus has high activity while being a p-type gallium-nitride-based material. Further, the second p-type epitaxial layer is disposed on the outer side wall, which forms the smaller angle than the right angle together with the second surface of the semiconductor substrate. That is, the second p-type epitaxial layer constitutes the outer side wall of the stack made of the gallium-nitride-based material, the outer side wall being inclined at a gentler angle than a right angle with respect to the semiconductor substrate. Hence, there is no need to etch the second p-type epitaxial layer for exposure as a preparation for joining the source electrode portion to the second p-type epitaxial layer. This prevents excessive erosion of the second p-type epitaxial layer and the loss of the high activity of the second p-type epitaxial layer due to the etching. As described above, the second p-type epitaxial layer, being in contact with the source electrode portion, has high activity. This achieves favorable ohmic contact between them. Accordingly, holes generated by an ionizing collision during the operation of the semiconductor device are efficiently retrieved to the source electrode portion. This improves the avalanche strength of the semiconductor device.

According to the other aspect of the present invention, the p-type epitaxial layer is disposed not only on the top surface of the stack, but also on the side wall of the stack. Accordingly, a pn junction is established not only in the vicinity of the top surface, but also in the vicinity of the side wall. A depletion layer extending from the pn junction in the vicinity of the side wall to all over the n-type epitaxial layer lessens an electric field at a Schottky interface between the n-type barrier layer and the anode electrode. This enhances the reverse withstand voltage of the semiconductor device. Further, the p-type epitaxial layer is not a p-type layer formed through ion implantation, but an epitaxial layer. The second p-type epitaxial layer thus has high activity while being a p-type gallium-nitride-based material. This further sufficiently achieves the aforementioned effect.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a schematic cross-sectional view of a fourth step in the method for manufacturing the semiconductor device in FIG. 1.

FIG. 6 is a schematic cross-sectional view of a fifth step in the method for manufacturing the semiconductor device in FIG. 1.

FIG. 10 is a schematic cross-sectional view of a ninth step in the method for manufacturing the semiconductor device in FIG. 1.

FIG. 14 is a schematic cross-sectional view of a thirteenth step in the method for manufacturing the semiconductor device in FIG. 1.

DESCRIPTION OF EMBODIMENT(S)

The following details embodiments of semiconductor devices and methods for manufacturing the same according to the present invention on the basis of the drawings. It is noted that the invention is not restricted by these embodiments, and is changeable as appropriate without departing from the scope of the invention. It is also noted that for easy understanding, individual members or the scales of the individual members can be different from those in practical use in the following drawings, and that this fact is also applicable to the relationships between the individual drawings.

First Embodiment

Summary of Configuration

Figure 1:
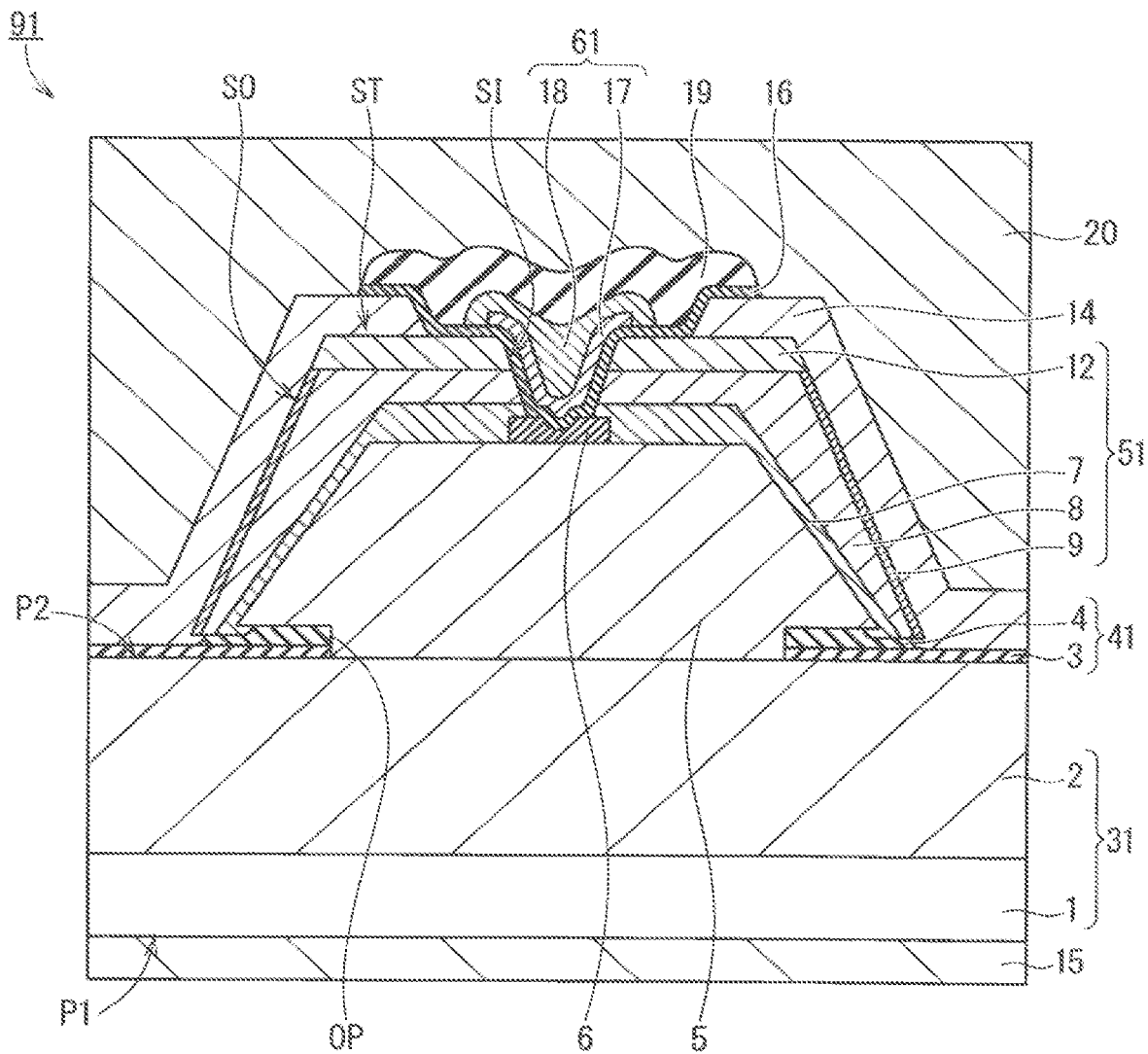
FIG. 1 is a schematic cross-sectional view of a configuration of a semiconductor device in a first embodiment of the present invention.

FIG. 1 is a schematic cross-sectional view of a configuration of a semiconductor device (MOSFET) 91 in a first embodiment. The following items (1) to (5) summarize the configuration of the semiconductor device 91.

(1) The semiconductor device 91 includes a semiconductor substrate (epitaxial substrate) 31, a first insulating layer 41, a second insulating layer 6, a stack 51, an n-type contact layer 12, a source electrode portion 14, a drain electrode 15, a gate insulating film 16, and a gate electrode 61. The semiconductor substrate 31 has a first surface (lower surface) P1 and a second surface P2 (upper surface) opposite the first surface P1. The first insulating layer 41 is disposed on the second surface P2 of the semiconductor substrate 31, and has an opening OP partly exposing the second surface P2. The second insulating layer 6 is disposed on the second surface P2 of the semiconductor substrate 31, and separated from the first insulating layer 41. The stack 51 includes, in sequence on the second surface P2 of the semiconductor substrate 31, a side n-type epitaxial layer 7, a first p-type epitaxial layer 8 having a first impurity concentration, and a second p-type epitaxial layer 9 having an impurity concentration higher than the first impurity concentration. The side n-type epitaxial layer 7, the first p-type epitaxial layer 8, and the second p-type epitaxial layer 9 are made of a gallium-nitride-based material. The stack 51 has the following: an outer side wall SO having a portion that is formed of the second p-type epitaxial layer 9, extending from the first insulating layer 41, and forming a smaller angle than a right angle together with the second surface P2 of the semiconductor substrate 31; an inner side wall SI having a portion that is formed of the first p-type epitaxial layer 8, and extending from the second insulating layer 6; and a top surface ST joining the outer side wall SO and the inner side wall SI together. The n-type contact layer 12 is disposed on the top surface ST of the stack 51, and is in contact with the first p-type epitaxial layer 8. The source electrode portion 14 is in contact with the n-type contact layer 12 on the top surface ST of the stack 51, and is in contact with the second p-type epitaxial layer 9 on the outer side wall SO of the stack 51. The drain electrode 15 is disposed on the first surface P1. The gate insulating film 16 is disposed on the inner side wall SI of the stack 51. The gate electrode 61 is disposed on the gate insulating film 16.

As such, the second p-type epitaxial layer 9 is not an implanted layer formed through ion implantation, but an epitaxial layer. The second p-type epitaxial layer 9 thus has high activity while being a p-type gallium-nitride-based material. Further, the second p-type epitaxial layer 9 is disposed on the outer side wall SO, which forms the smaller angle than the right angle together with the second surface P2 of tine semiconductor substrate 31. That is, the second p-type epitaxial layer 9 constitutes the outer side wall SO of the stack 51 made of the gallium-nitride-based material, the outer side wall SO being inclined at a gentler angle than a right angle with respect to the semiconductor substrate 31. Hence, there is no need to etch to expose the second p-type epitaxial layer 9 as a preparation for joining the source electrode portion 14 to the second p-type epitaxial layer 9. This prevents excessive erosion of the second p-type epitaxial layer 9 and the loss of the high activity of the second p-type epitaxial layer 9 due to the etching. As described above, the second p-type epitaxial layer 9, being in contact with the source electrode portion 14, has high activity. This achieves favorable ohmic contact between them. Accordingly, holes generated by an ionizing collision during the operation of the semiconductor device 91 are efficiently retrieved to the source electrode portion 14. This improves the avalanche strength of the semiconductor device 91.

Further, a depletion layer extending from the second p-type epitaxial layer on the outer side wall SO lessens an electric field that is apt to concentrate in the vicinity of a location where the bottom of the gate electrode 61 and the inner side wall SI face each other. Consequently, electron-hole pair generation by the ionizing collision is suppressed. This improves the avalanche strength of the semiconductor device 91.

Still further, the second p-type epitaxial layer 9 constitutes the outer side wall SO of the stack 51. Consequently, nothing hinders hydrogen from detaching from the first p-type epitaxial layer 8 and the second p-type epitaxial layer 9, which is made of the gallium-nitride-based material, during the annealing of the stack 51 for activation. This suppresses a reduction in activity of the first p-type epitaxial layer 8 and the second p-type epitaxial layer 9 due to hydrogen residues.

Yet further, the second p-type epitaxial layer 9 is disposed on the outer side wall SO of the stack 51, and is thus disposed to be inclined with respect to the semiconductor substrate 31. Consequently, the second p-type epitaxial layer 9, which is not a main path for a source/drain current, has a smaller area in a surface parallel to the semiconductor substrate 31. This reduces the on-resistance of the semiconductor device 91.

Still yet further, the outer side wall SO of the stack 51 forms a smaller angle than a right angle together with the second surface P2 of the semiconductor substrate 31. Consequently, provided is a current path extending, without narrowing, from the source electrode portion 14 toward the semiconductor substrate 31. This reduces the on-resistance of the semiconductor device 91.

Still further, the first insulating layer 41 is disposed at the lower end of the outer side wall SO of the stack 51. Consequently, the concentration of an electric field at the lower end of the outer side wall SO of the stack 51 is lessened. This enhances the withstand voltage of the semiconductor device 91.

Yet further, the second insulating layer 6 is disposed at the lower end of the inner side wall SI of the stack 51. Consequently, the concentration of an electric field at the lower end of the inner side wall SI of the stack 51, i.e., at the lower corner of a trench gate structure, is lessened. This enhances the withstand voltage of the semiconductor device 91.

(2) The semiconductor device 91 preferably further includes a bottom n-type epitaxial layer 5. The bottom n-type epitaxial layer 5 is disposed on the second surface P2 of the semiconductor substrate 31 and made of a gallium-nitride-based material. The second insulating layer 6 is disposed on the second surface P2 of the semiconductor substrate 31 with the bottom n-type epitaxial layer 5 interposed therebetween. The stack 51 is disposed on the second surface P2 of the semiconductor substrate 31 with the bottom n-type epitaxial layer 5 interposed therebetween.

As such, the stack 51 has the inner side wall SI and the outer side wall SO, and is configured such that only the former is disposed on the bottom n-type epitaxial layer 5 with the second insulating layer 6 interposed therebetween. Thus, the outer side wall SO is disposed more deeply than the inner side wall SI. Thus, the depletion layer easily extends from the second p-type epitaxial layer 9 on the outer side wall SO to the vicinity of the location where the bottom of the gate electrode 61 and the inner side wall SI face each other. Consequently, the electric field, which is apt to concentrate in the location where the bottom of the gate electrode 61 and the inner side wall SI face each other, i.e., in the vicinity of the lower corner of the trench gate structure, is efficiently lessened. This improves the avalanche strength of the semiconductor device 91.

further, the bottom n-type epitaxial layer 5 can function as part of a drift layer of the semiconductor device 91. Consequently, the drift layer of the semiconductor device 91 has a greater thickness than a drift layer of a semiconductor device without the bottom n-type epitaxial layer 5. This enhances the withstand voltage of the semiconductor device 91.

(3) The semiconductor device 91 preferably further includes an interlayer insulating film 19 and a cover electrode layer 20. The interlayer insulating film 19 is disposed on the gate electrode 61. The cover electrode layer 20 is disposed on the source electrode portion 14 and the interlayer insulating film 19. The interlayer insulating film 19 and the gate insulating film 16 do not substantially contain hydrogen.

This suppresses the reduction in activity of the first p-type epitaxial layer 8 and the second p-type epitaxial layer 9 due to hydrogen in the interlayer insulating film 19 and the gate insulating film 16. The reduction in activity of the second p-type epitaxial layer 9 is suppressed, thereby further improving the avalanche strength. In addition, the reduction in activity of the first p-type epitaxial layer 8 is suppressed, thereby improving channel mobility.

(4) The gate insulating film 16 is preferably disposed on the second insulating layer 6.

Consequently, the concentration of the electric field at the bottom of the trench gate structure is lessened. This enables the gate insulating film 16 to be resistant to an electrical breakdown.

(5) The gate insulating film 16 preferably includes at least one of an $Al_2O_3$ film and a $SiO_2$ film.

As such, the gate insulating film 16 is made of a material having a sufficiently large band offset with respect to the gallium-nitride-based material. This lowers a gate leak current.

Summary of Manufacture Method

FIGS. 2 to 24 schematically illustrate, step-by-step, a method for manufacturing the semiconductor device (MOSFET) 91 in the present embodiment. The following items (6) to (14) summarize the method for manufacturing the semiconductor device 91.

Figure 2:
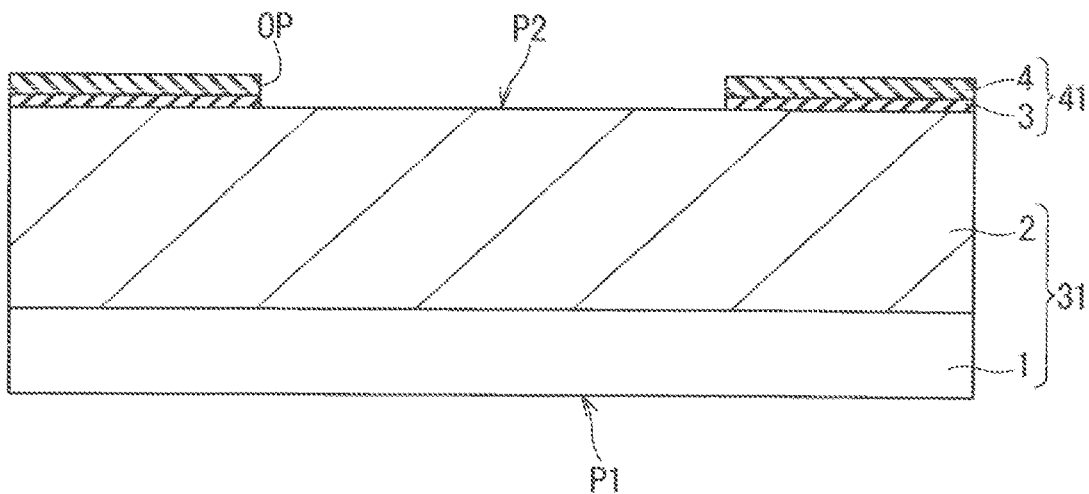
FIG. 2 is a schematic cross-sectional view of a first step in a method for manufacturing the semiconductor device in FIG. 1.
Figure 18:
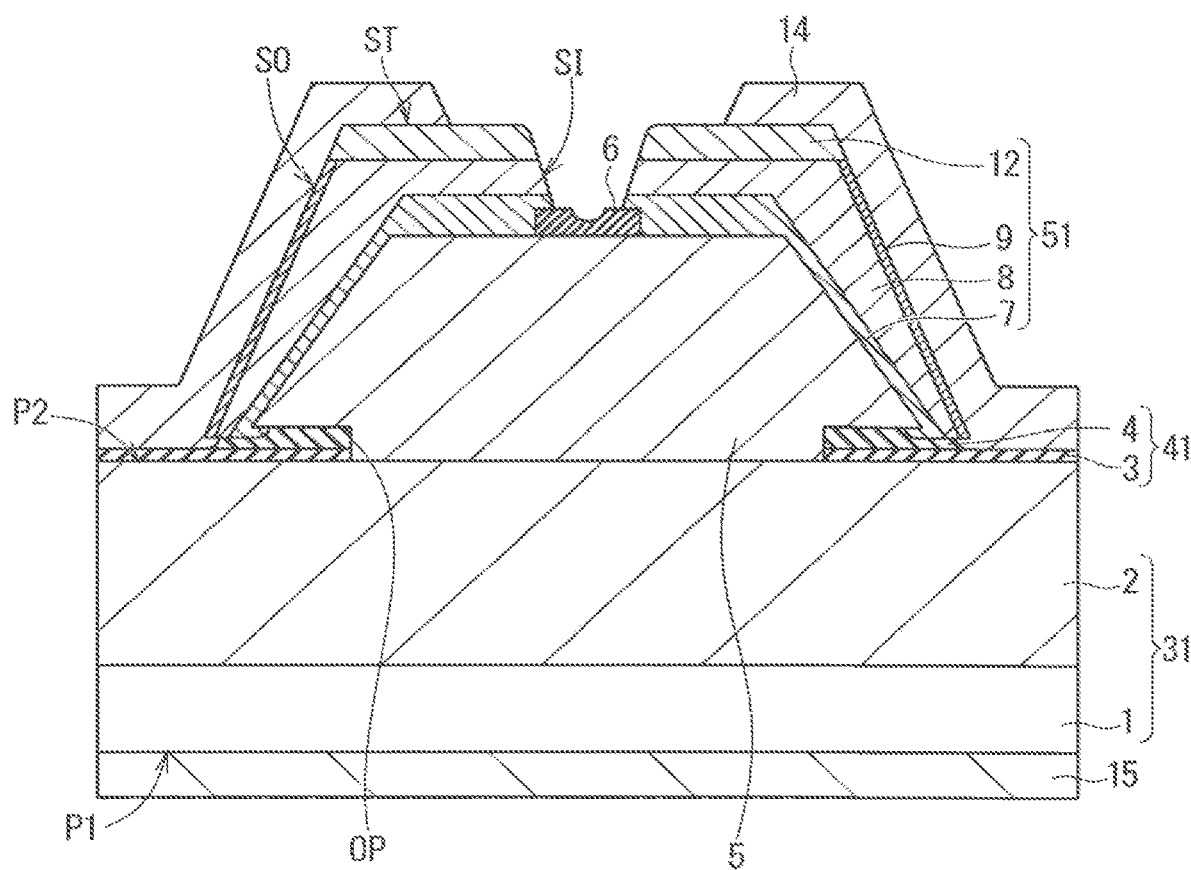
FIG. 18 is a schematic cross-sectional view of a seventeenth step in the method for manufacturing the semiconductor device in FIG. 1.
Figure 19:
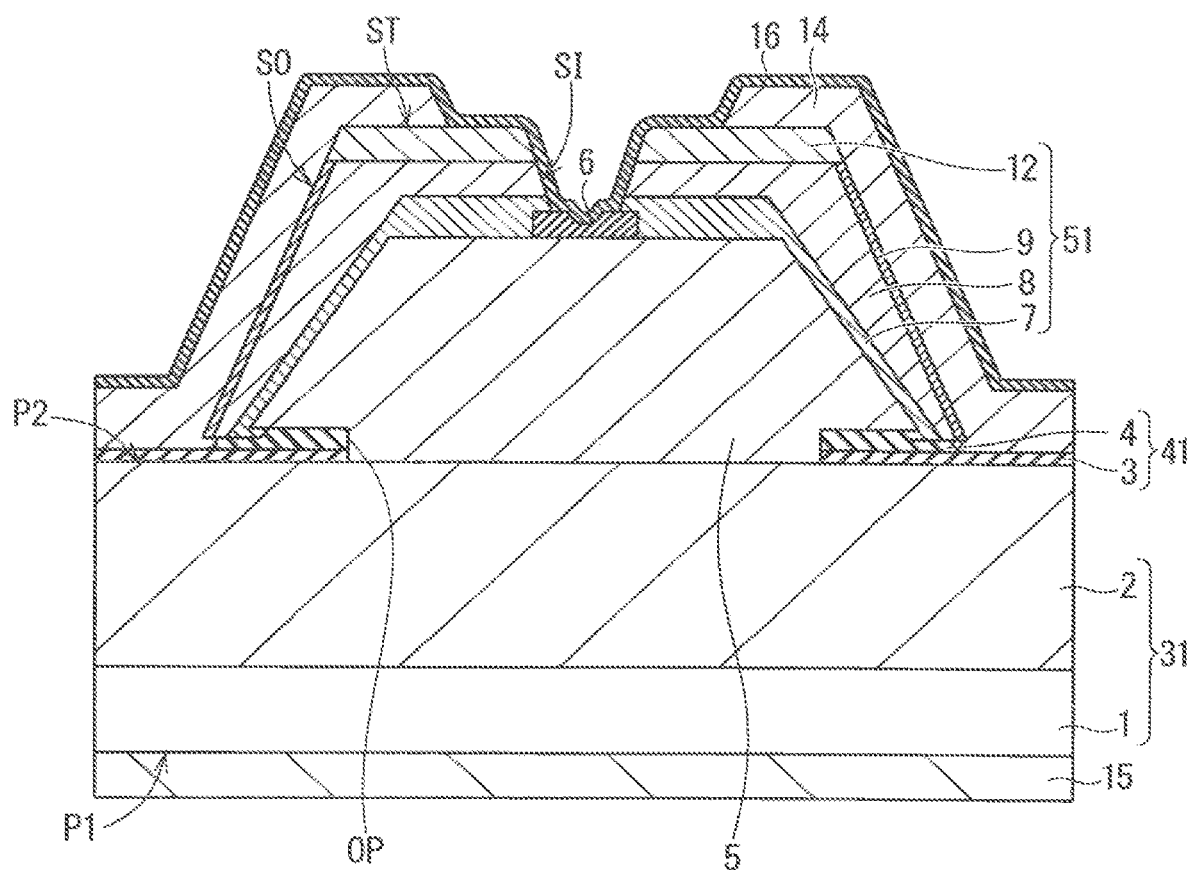
FIG. 19 is a schematic cross-sectional view of an eighteenth step in the method for manufacturing the semiconductor device in FIG. 1.
Figure 20:
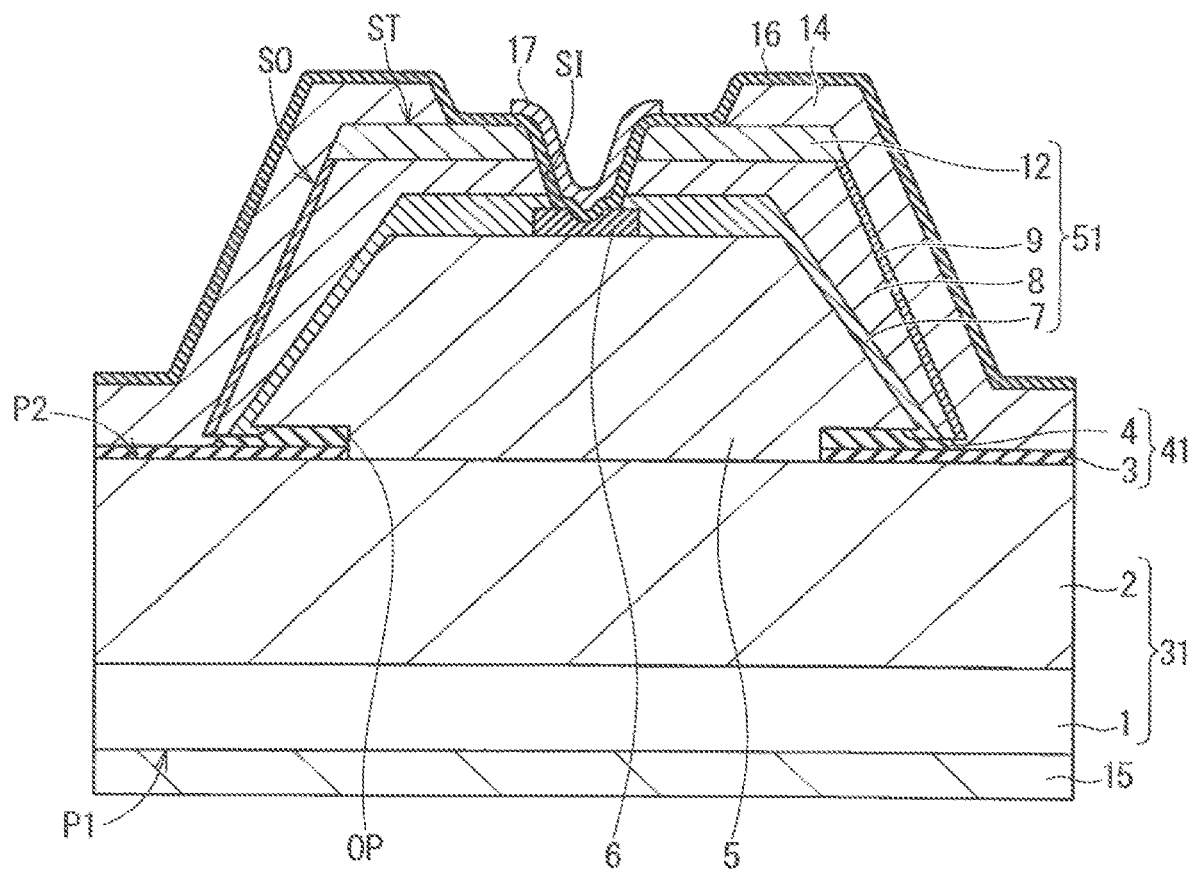
FIG. 20 is a schematic cross-sectional view of a nineteenth step in the method for manufacturing the semiconductor device in FIG. 1.
Figure 21:
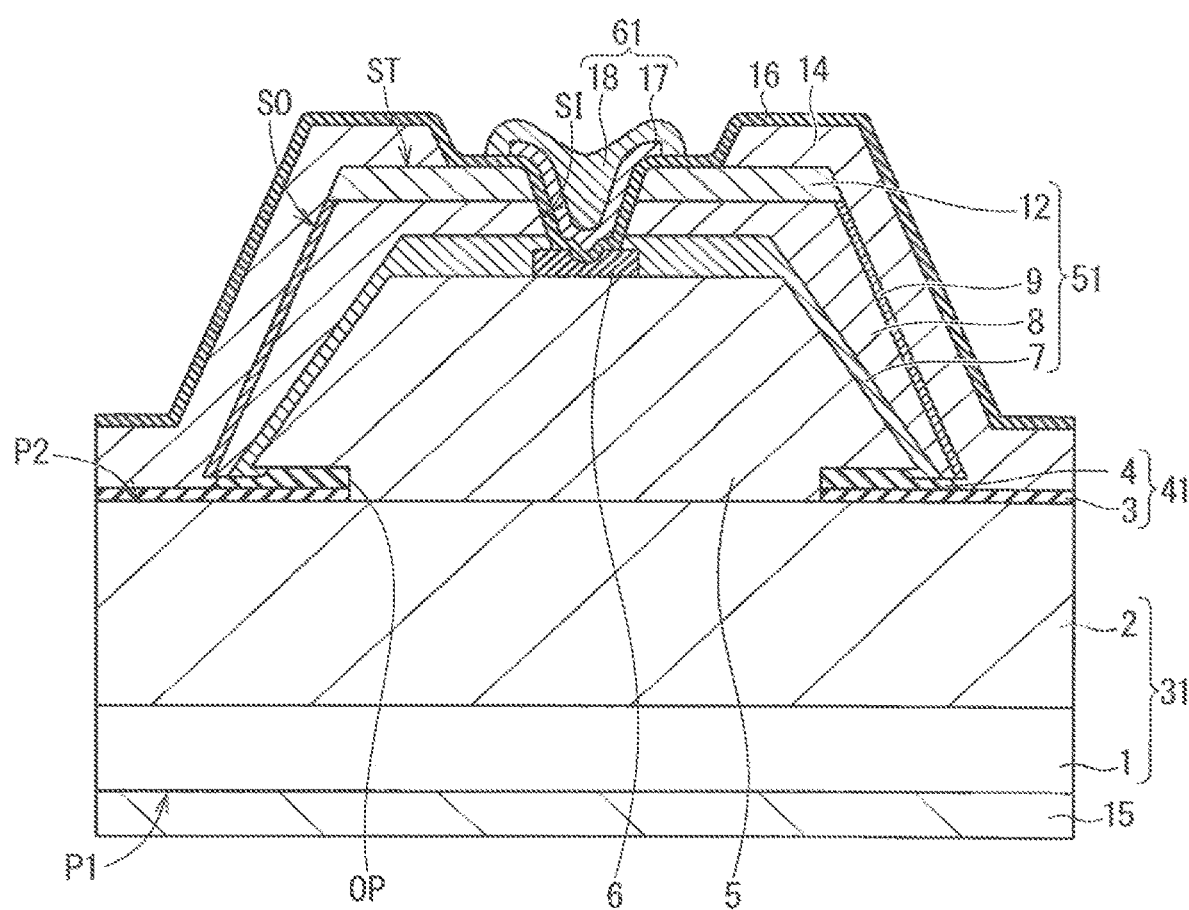
FIG. 21 is a schematic cross-sectional view of a twentieth step in the method for manufacturing the semiconductor device in FIG. 1.

(6) The method for manufacturing the semiconductor device 91 includes the following steps. Referring to FIG. 2, the semiconductor substrate (epitaxial substrate) 31, which has the first surface (lower surface) P1 and the second surface (upper surface) P2, is prepared. The first insulating layer 41, which has the opening OP partly exposing the second surface P2, is formed on the second surface P2 of the semiconductor substrate 31. Referring to FIG. 5, the second insulating layer 6, which is separated from the first insulating layer, is formed on the second surface P2 of the semiconductor substrate 31. Referring to FIG. 6, the gallium-nitride-based material undergoes selective epitaxial-growth on the second surface P2 of the semiconductor substrate 31 using the first insulating layer 41 and the second insulating layer 6 as growth masks. Thus, the side n-type epitaxial layer 7, the p-type epitaxial layer 8 having the first impurity concentration, and the p-type epitaxial layer 9 having the higher impurity concentration than the first impurity concentration are deposited in sequence. This forms the stack 51 having the outer side wall SO extending from the first insulating layer 41 and forming the smaller angle than the right angle together with the second surface P2 of the semiconductor substrate 31, the inner side wall SI extending from the second insulating layer 6, and the top surface ST joining the outer side wall and the inner side wall SI together. Referring to FIG. 10, the n-type contact layer 12 in contact with the first p-type epitaxial layer 8 is formed on the top surface ST of the stack 51. Referring to FIG. 18, the source electrode portion 14, which is in contact with the n-type contact layer 12 on the top surface ST of the stack 51 and is in contract with the second p-type epitaxial layer 9 on the outer side wall SO of the stack 51, is formed. The drain electrode 15 is formed on the first surface P1. Referring to FIG. 19, the gate insulating film 16 is formed on the inner side wall SI of the stack 51. Referring to FIGS. 20 and 21, the gate electrode 61 is formed on the gate insulating film 16.

This achieves effects similar to the effects described in item (1). Further, the inner side wall SI for the trench gate structure is formed through selective growth. Consequently, there is no need to use dry-etching for forming the inner side wall SI. This prevents a reduction in crystallinity of the inner side wall SI due to the dry-etching. As a result, a reduction in channel mobility due to the reduction in crystallinity is prevented. Consequently, the on-resistance is reduced when compared to that in the use of the dry-etching for forming the trench gate structure.

Figure 3:
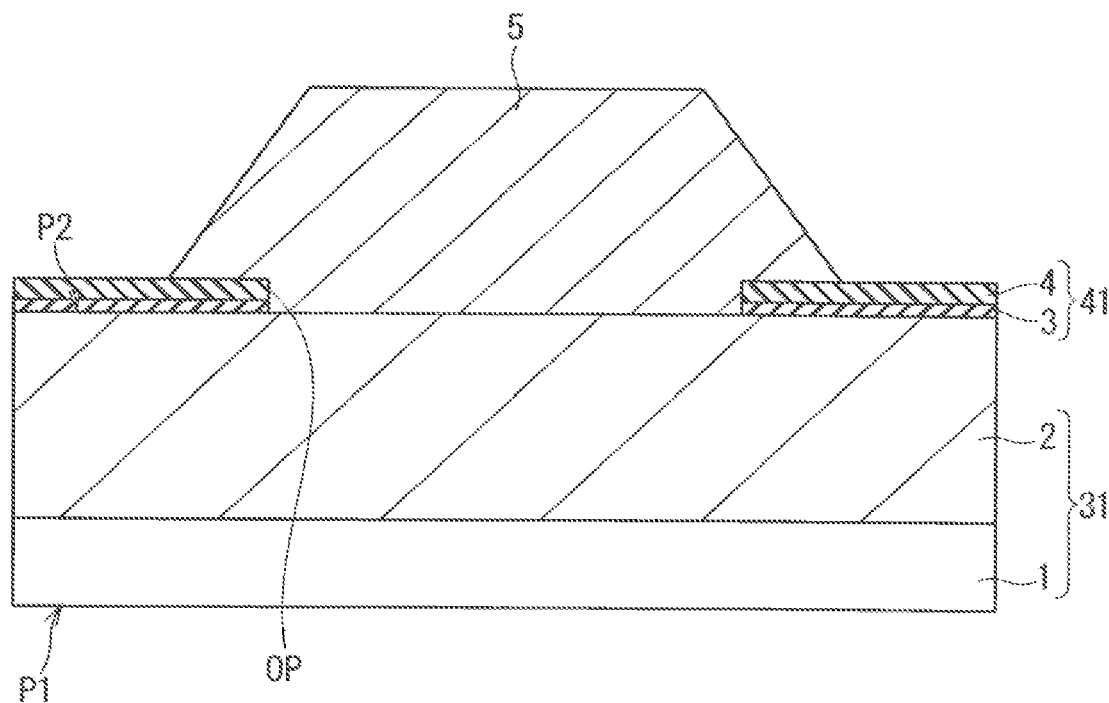
FIG. 3 is a schematic cross-sectional view of a second step in the method for manufacturing the semiconductor device in FIG. 1.
Figure 4:
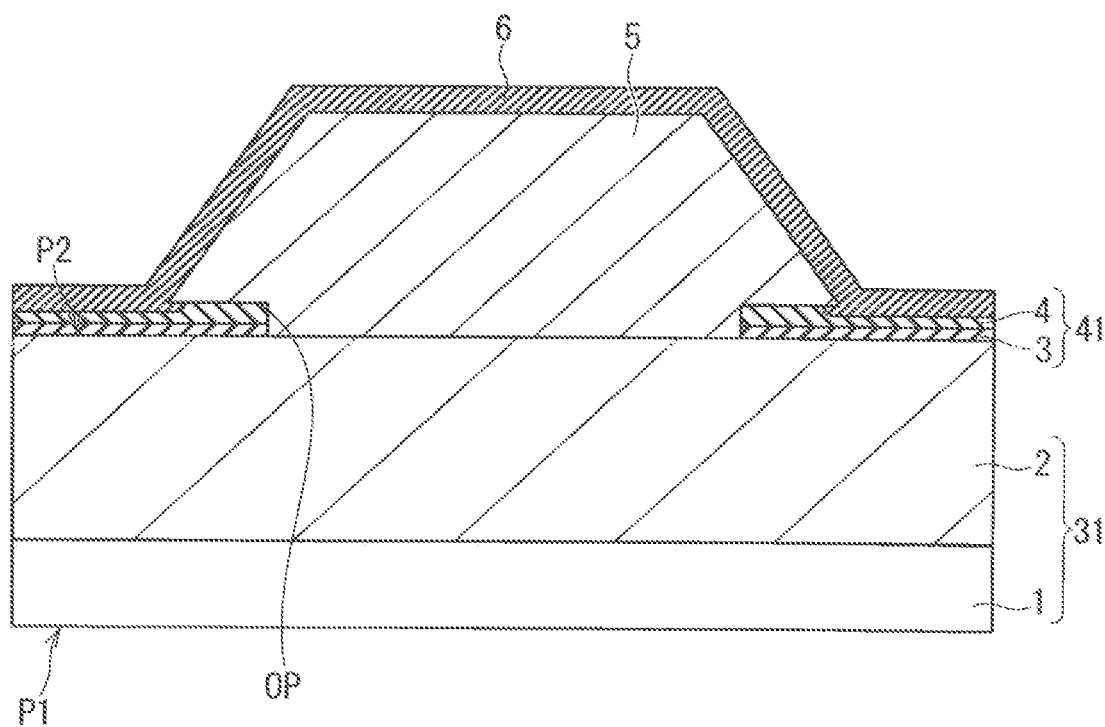
FIG. 4 is a schematic cross-sectional view of a third step in the method for manufacturing the semiconductor device in FIG. 1.

(7) Referring to FIG. 3, an n-type gallium-nitride-based material preferably undergoes selective epitaxial-growth on the second surface P2 of the semiconductor substrate 31 using the first insulating layer 41 as a growth mask. This forms the bottom n-type epitaxial layer 5. Referring to FIGS. 4 and 5, the aforementioned step of forming the second insulating layer 6 is performed by forming the second insulating layer 6 onto the second surface P2 of the semiconductor substrate 31 with the bottom n-type epitaxial layer 5 interposed therebetween. Referring to FIG. 6, the step of forming the stack 51 is performed through selective epitaxial-growth on the second surface P2 of the semiconductor substrate 31 with the bottom n-type epitaxial layer 5 interposed therebetween.

This achieves an effect similar to the effect described in item (2).

(8) Referring to FIGS. 3 and 6, the step of forming the stack 51 is preferably performed at a higher growth temperature than the step of forming the bottom n-type epitaxial layer 5.

Consequently, an angle formed by the second surface P2 of the semiconductor substrate 31 and the outer side wall SO of the stack 51 is greater than an angle formed by the second surface P2 of the semiconductor substrate 31 and the side wall of the bottom n-type epitaxial layer 5. This enables the stack 51 to be more sufficiently formed on the side wall of the bottom n-type epitaxial layer 5.

Figure 12:
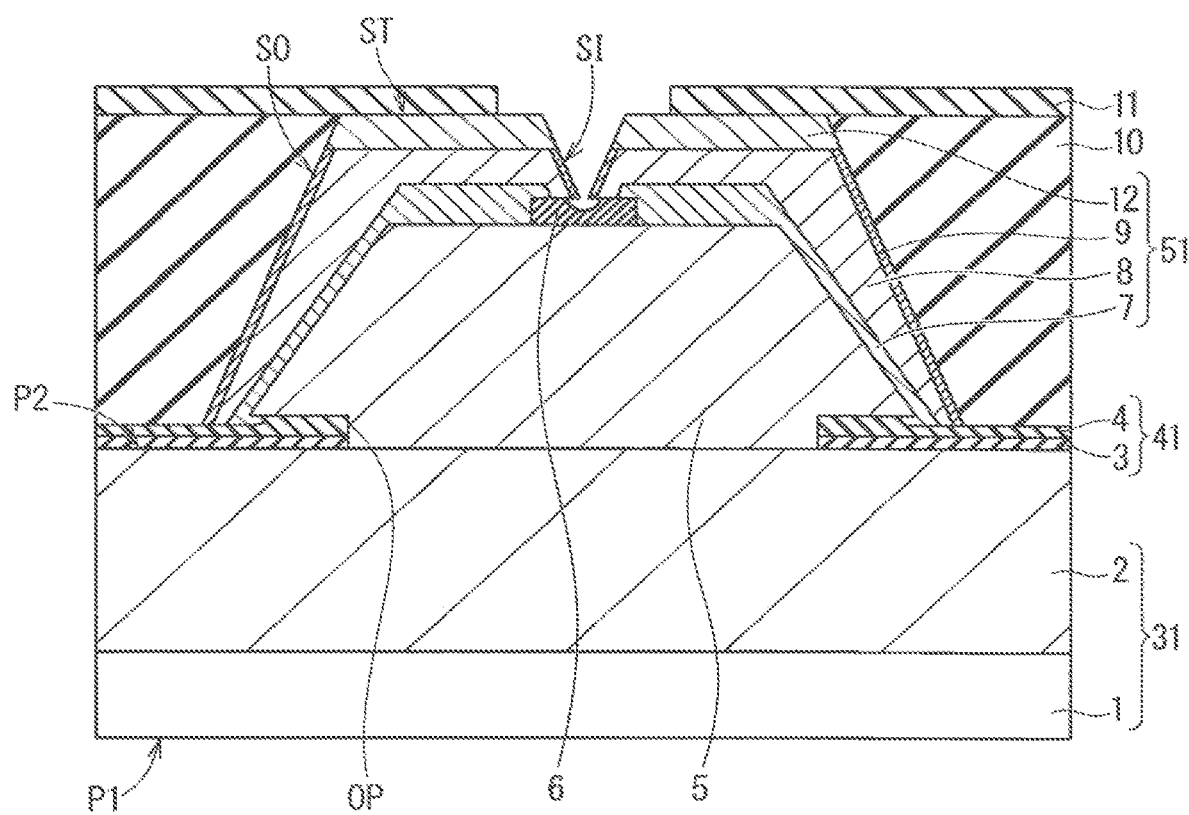
FIG. 12 is a schematic cross-sectional view of an eleventh step in the method for manufacturing the semiconductor device in FIG. 1.
Figure 13:
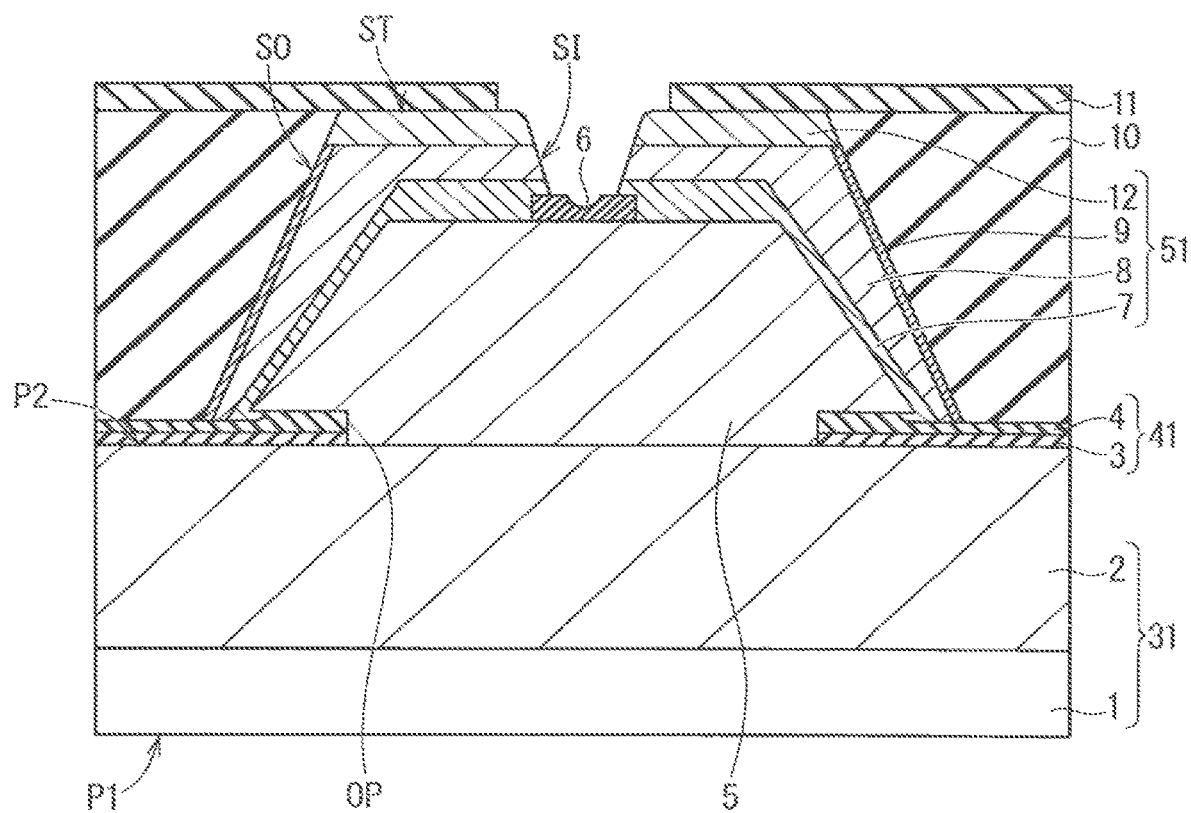
FIG. 13 is a schematic cross-sectional view of a twelfth step in the method for manufacturing the semiconductor device in FIG. 1.

(9) Referring to FIGS. 12 and 13, a portion of the second p-type epitaxial layer 9, the portion being on the inner side wall SI of the stack 51, is removed before the gate insulating film 16 (FIG. 19) is formed.

Thus, the first p-type epitaxial layer 8 rather than the second p-type epitaxial layer 9 faces the gate insulating film 16 on the inner side wall SI. Consequently, the second p-type epitaxial layer 9 having a lower impurity concentration forms a channel. Accordingly, Coulomb scattering in the channel is reduced. The channel mobility is thus improved. This reduces the on-resistance of the semiconductor device 91.

Figure 7:
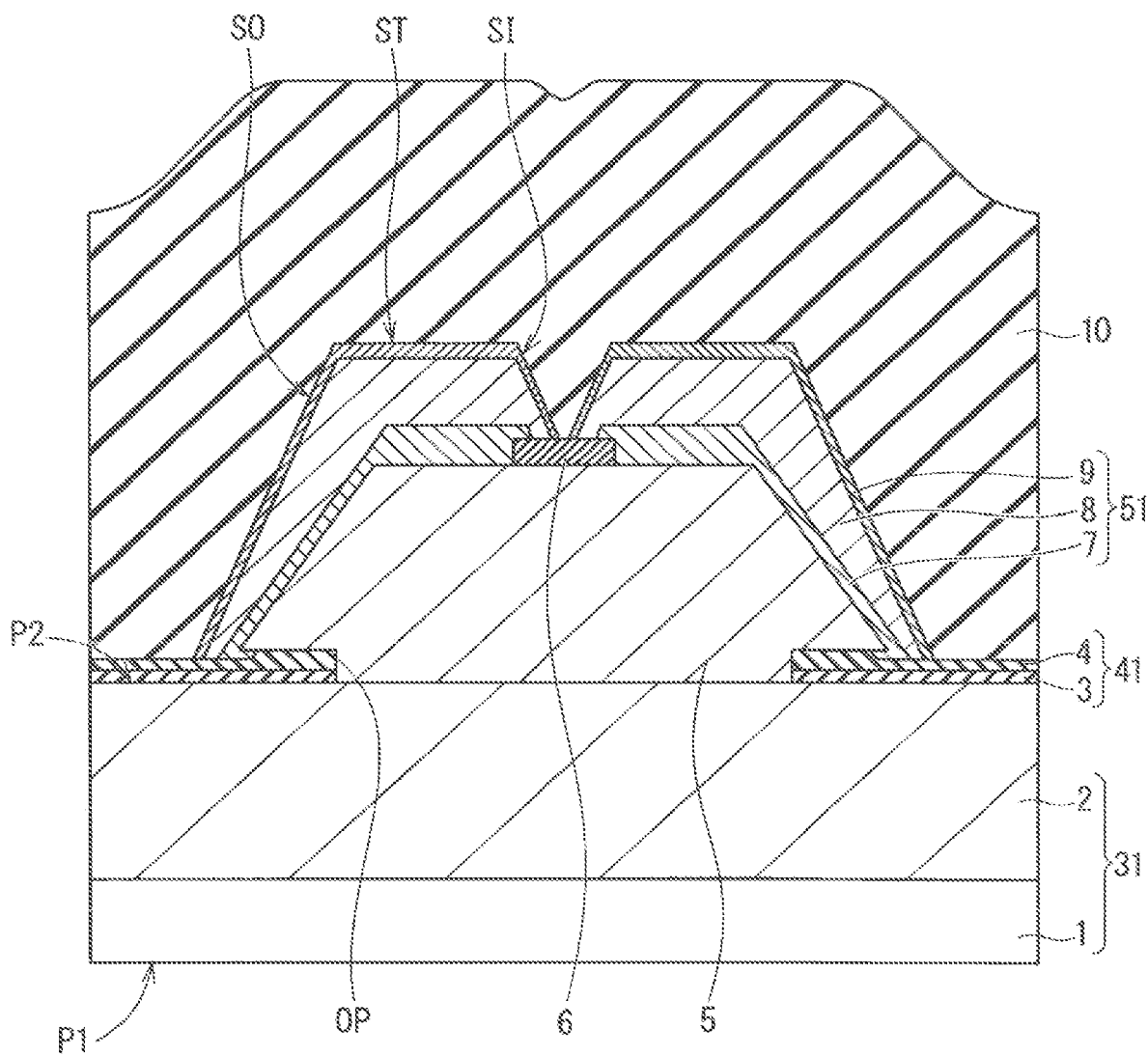
FIG. 7 is a schematic cross-sectional view of a sixth step in the method for manufacturing the semiconductor device in FIG. 1.
Figure 8:
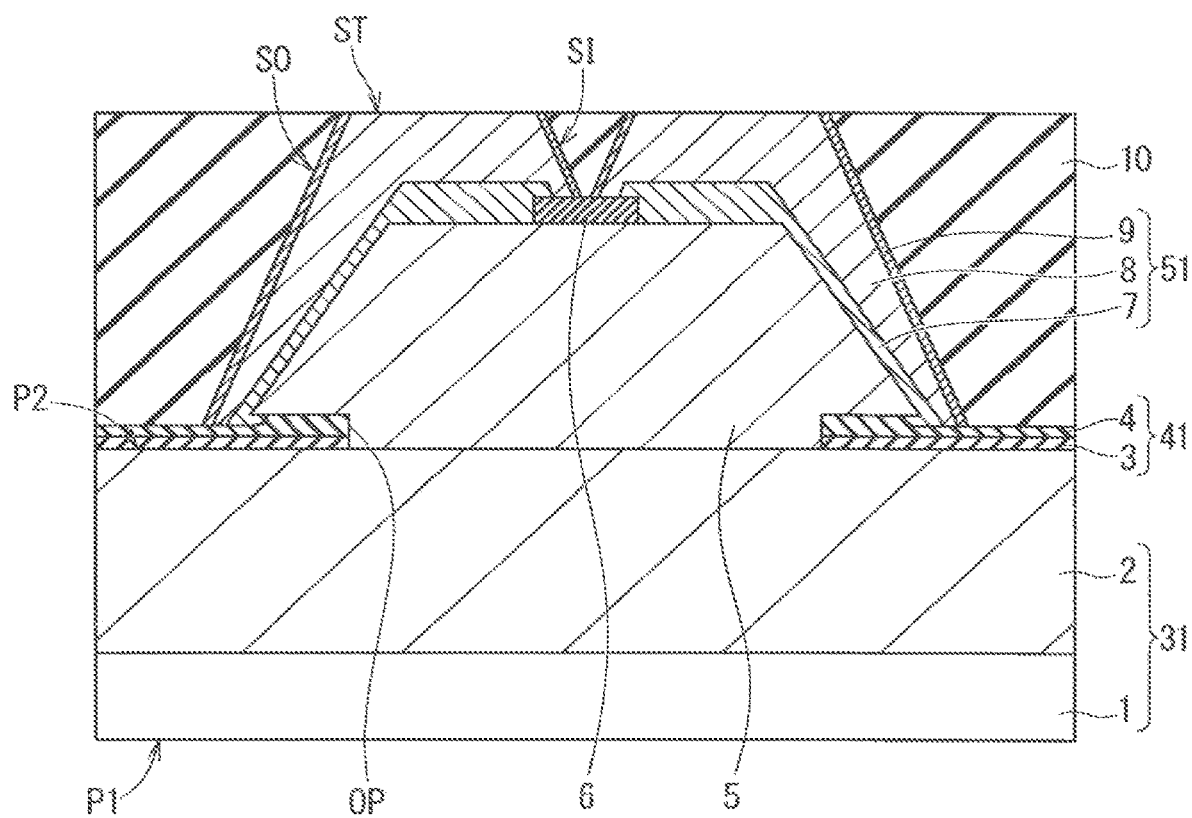
FIG. 8 is a schematic cross-sectional view of a seventh step in the method for manufacturing the semiconductor device in FIG. 1.
Figure 15:
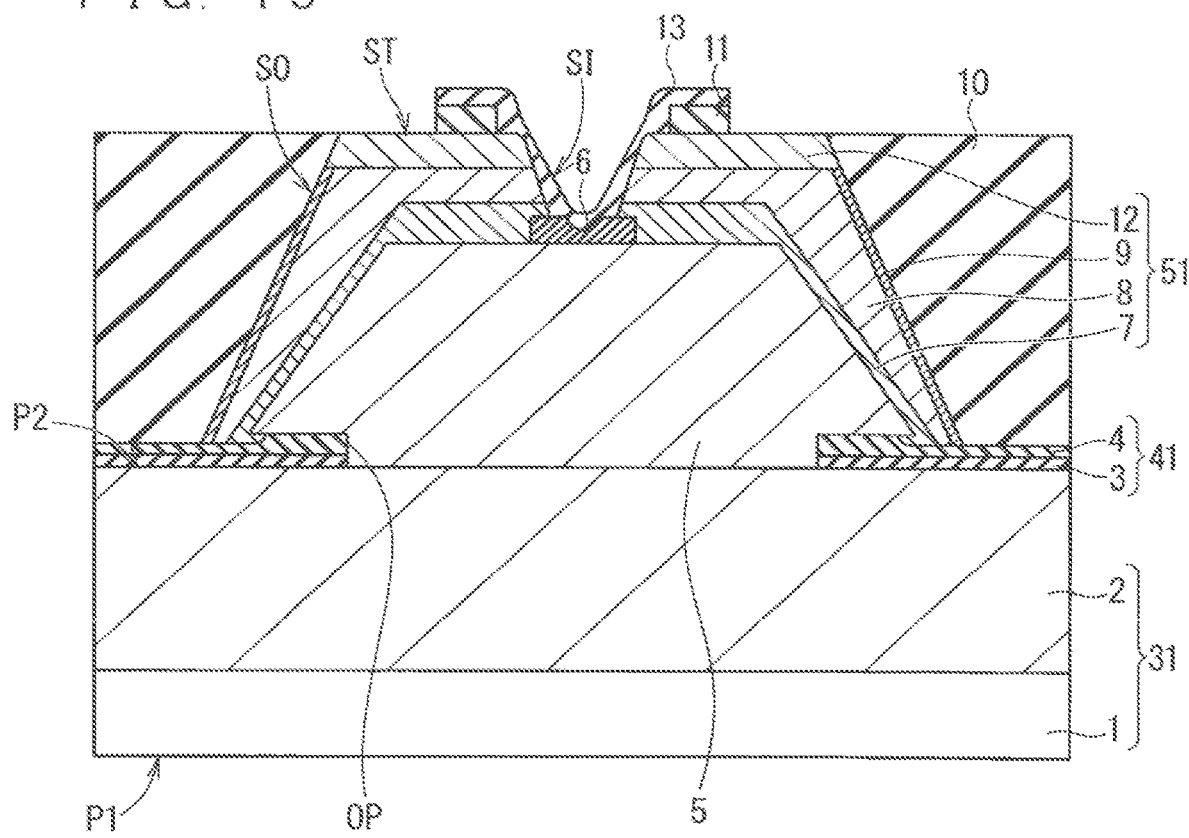
FIG. 15 is a schematic cross-sectional view of a fourteenth step in the method for manufacturing the semiconductor device in FIG. 1.
Figure 16:
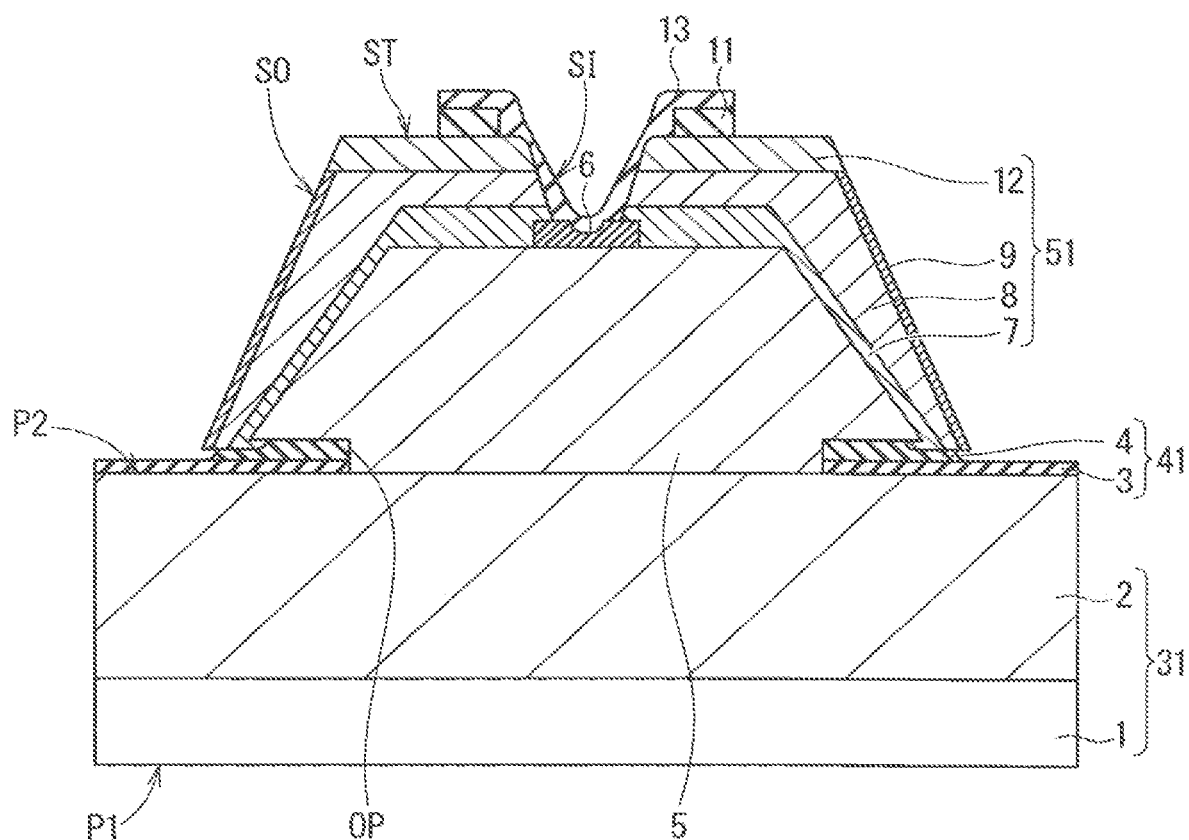
FIG. 16 is a schematic cross-sectional view of a fifteenth step in the method for manufacturing the semiconductor device in FIG. 1.

(10) Referring to FIG. 7, a filling layer 10 covering the outer side wall SO of the stack 51 is preferably formed. Referring to FIG. 8, the top surface ST then undergoes polishing to remove a portion of the second p-type epitaxial layer 9, the portion being on the top surface ST. Referring to FIGS. 15 and 16, the filling layer 10 is then removed.

Accordingly, the second p-type epitaxial layer 9 is removed on the top surface ST. Moreover, this removal is performed through polishing; thus, damage on the first p-type epitaxial layer 8 forming a channel is suppressed when compared to removal performed through dry-etching. This prevents a reduction in channel mobility due to the aforementioned removal step.

(11) Referring to FIG. 2, the step of forming the first insulating layer 41 preferably includes the following steps. A first insulating film 3 made of a first material is deposited on the second surface P2 of the semiconductor substrate 31. A second insulating film 4 made of a second material different from the first material is deposited on the first insulating film 3. The opening OP is formed in the first insulating film 3 and the second insulating film 4. Referring to FIGS. 15 and 16, the aforementioned step of removing the filling layer 10 is performed through etching under an etching condition in which the first material has a smaller etching rate than the second material.

Accordingly, the first insulating film 3, which is made of the first material, stops excessive etching progress more reliably during the etching of the filling layer 10. This prevents the etching from progressing to penetrate the first insulating layer 41. Consequently, the first insulating layer 41 more certainly establishes electrical insulation between the source electrode portion 14 and the semiconductor substrate 31. This improves the manufacture yield of the semiconductor device 91.

(12) Referring to FIG. 10, the n-type contact layer 12 is preferably formed through donor impurity implantation onto the first p-type epitaxial layer 8 which constitutes the top surface ST of the stack 51, after the portion of the second p-type epitaxial layer 9, the portion being on the top surface ST, is removed (FIGS. 7 and 8).

Thus, the first p-type epitaxial layer 8, having a lower impurity concentration than the second p-type epitaxial layer 9, undergoes donor impurity implantation onto the top surface ST of the stack 51. Accordingly, donor impurity implantation in a smaller implantation concentration achieves a conductivity-type reversal into an n-type. Consequently, an increase in electrical resistance due to implantation damage and impurity scattering is suppressed. This reduces the on-resistance of the semiconductor device 91.

(13) Referring to FIG. 10, the n-type contact layer 12 is preferably formed through donor impurity implantation onto the top surface ST of the stack 51.

Thus, the n-type contact layer 12 is formed without the use of a deposition process. This prevents a reduction in activity of the first p-type epitaxial layer 8 or the second p-type epitaxial layer 9 due to a hydrogen-based gas, which is typically used in a process of depositing a gallium-nitride-based material.

(14) The step of forming the gate electrode 61 (FIG. 21) preferably includes the following steps. Referring to FIG. 20, a metal pattern portion 17 is formed through a lift-off process. Referring to FIG. 21, a plating portion 18 covering the metal pattern portion 17 is formed through an electric-field plating process.

The plating portion 18 thus supplies the thickness of the gate electrode 61, thereby making the metal pattern portion 17 thinner. This facilitates the lift-off step when compared to a lift-off step for forming a thicker metal pattern.

Details

Although overlapping the foregoing, the following describes the MOSFET 91 in a more specific manner. It is noted that the following specific materials, specific impurity concentrations, and specific manufacture conditions are preferable examples, and thus do not exclude any other aspects.

Referring to FIG. 1, the MOSFET 91 has double trenches disposed in the semiconductor region. To be specific, provided are a trench formed by the inclined outer side wall SO (hereinafter, referred to as an "outer trench") and a trench formed by the inclined inner side wall SI (hereinafter, referred to as an "inner trench"). The outer trench is formed deeper than the inner trench. The inner trench is round at its upper corner. The outer trench is, along its inclined surface, provided with the first p-type epitaxial layer 8, the second p-type epitaxial layer 9, and the source electrode portion 14. The source electrode portion 14 is in ohmic contact with the second p-type epitaxial layer 9 on the side surface of the outer trench. The outer trench has a lower corner provided with the first insulating layer 41, which lessens the concentration of the electric field. The inner trench has a bottom covered with the second insulating layer 6 as well as the gate insulating film 16.

The epitaxal, substrate 31 has an n-type. To be specific, the epitaxial substrate 31 has an n-type monocrystal substrate 1 and an n-type epitaxial portion (n-type region) 2. The n-type monocrystal substrate 1 constitutes the lower surface P1 of the epitaxial substrate 31. The n-type epitaxial portion 2 constitutes the upper surface P2 of the epitaxial substrate 31. The n-type monocrystal substrate 1 is made of a GaN-based material, has an n-type, and is thus conductive. The n-type monocrystal substrate 1 is a GaN substrate in the present embodiment. Formed on the n-type monocrystal substrate 1 is an n-type GaN epitaxial layer as the n-type epitaxial portion 2 made of a GaN-based material.

Formed on the n-type epitaxial portion 2 is an n-type GaN epitaxial layer as the bottom n-type epitaxial layer 5 with the first insulating film 3 and the second insulating film 4 interposed therebetween. Moreover, the side n-type epitaxial layer 7, the first p-type epitaxial layer 8, and the second p-type epitaxial layer 9 are sequentially stacked on the bottom n-type epitaxial layer 5 with the second insulating layer 6 partly interposed therebetween. To be specific, the n-type GaN epitaxial layer, a first p-type GaN epitaxial layer, and a second p-type GaN epitaxial layer are stacked.

The n-type epitaxial portion 2, the bottom n-type epitaxial layer 5, and the side n-type epitaxial layer 7 are doped with silicon (Si) at about $1 \times 10^{16}$ cm$^{-3}$. Further, the first p-type epitaxial layer 8 is doped with magnesium (Mg) at about $1 \times 10^{18}$ cm$^{-3}$. Still further, the second p-type epitaxial layer 9 is doped with Mg at about $1 \times 10^{20}$ cm$^{-3}$. It is noted that beryllium (Be) may be doped instead of Mg.

The n-type contact layer 12, which is an impurity-implanted layer, is disposed at the upper part of the stack 51. A doping species in the n-type contact, layer 12 is Si at a peak concentration of about $5 \times 10^{19}$ cm$^{-3}$. The source electrode portion 14 is in contact with the n-type contact layer 12 on the top surface ST, and is in contact with the second p-type epitaxial layer 9 on the outer side wall SO. The metal pattern portion 17 and the plating portion 18 are embedded in the inner trench as the gate electrode 61 with the gate insulating film 16 interposed therebetween. The gate insulating film 16 does not substantially contain hydrogen. The description "not substantially contain hydrogen" herein means that hydrogen has a small content to such an extent that an acceptor concentration in the first p-type epitaxial layer 8 does not lower by one or more orders of magnitude when compared to that before the formation of the gate insulating film 16. The gate electrode 61 is electrically insulated from the source electrode portion 14 and the cover electrode layer 20 by the interlayer insulating film 19. The drain electrode 15 in contact with the n-type monocrystal substrate 1 is disposed on the lower surface P1 of the epitaxial substrate 31.

The following describes a method for manufacturing the MOSFET 91.

Referring to FIG. 2, the n-type monocrystal substrate 1 is firstly prepared as a support substrate. The n-type monocrystal substrate 1 is an n-type GaN substrate having a c-plane, i.e., (0001), as a main surface. The n-type monocrystal substrate 1 is next cleansed. The n-type epitaxial portion 2 is then formed on the n-type monocrystal substrate 1 through a process, such as metal-organic vapor phase epitaxy (MOVPE). Temperature during epitaxial growth is about 1050° C. Trimethyl gallium (TMG), silane (SiH$_4$), and ammonia (NH$_3$) are used for source gases. A gas flow rate corresponding to each material is determined in accordance with necessary dopant concentration or other things. Hydrogen (H$_2$) is used as a carrier gas.

The first insulating film 3 and the second insulating film 4 are formed on the n-type epitaxial portion 2 as the first insulating layer 41 after the formation of the n-type epitaxial portion 2. The first insulating film 3 is made of, for instance, an aluminum nitride (AlN). The second insulating film 4 is made of, for instance, silicon oxide (SiO$_2$). Suitable examples of a film formation process include a sputtering process and a chemical vapor deposition (CVD) process. The first insulating layer 41 is used as a mask for selective epitaxial-growth, which will be described later on, and hence preferably has no defect such as pin holes. Accordingly, the first insulating layer 41 preferably has a thickness of about 50 nm or more. The first insulating layer 41, which is formed of the first insulating film 3 and the second insulating film 4, undergoes patterning after formed. To be specific, a resist mask is firstly formed through photolithography. The second insulating film 4 then undergoes patterning with, for instance, a buffered hydrofluoric acid. The first insulating film 3 undergoes patterning using the second insulating film 4 as a hard mask after the resist mask is removed. This forms the opening OP in the first insulating layer 41.

It is noted that the first insulating layer 41 is formed as a multi-layer film in order to prevent the etching (FIGS. 15 and 16), which will be described later on, from progressing to penetrate the first insulating layer 41 as described in the item "(11)". The first insulating layer 41 may be a mono-layer film, when there is no such possibility.

Referring to FIG. 3, GaN is selectively grown through a process again, such as a MOVPE after the mask for selective growth is formed as described above. At this time, temperature and pressure control during the epitaxial growth enables facet growth, c-plane growth, or growth that is intermediated between them to be selected. A technique of such growth control is reported by aforementioned Non-Patent Document 1 for instance. Applying this technique forms the bottom n-type epitaxial layer 5 having a trapezoidal shape (mesa shape).

Referring to FIG. 4, the second insulating layer 6 is formed after substrate cleansing. A SiO$_2$ film having a thickness of 100 nm is formed for instance. For a film formation process, a sputtering process or a CVD process can be used. An application film may be formed with spin-on-glass (SOG) instead of the use of these processes.

Referring to FIG. 5, the second insulating layer 6 next undergoes patterning through photolithography and etching with a buffered hydrofluoric acid. A resist pattern (not shown) formed through the photolithography is removed through organic cleansing after the etching process is completed.

Referring to FIG. 6, the side n-type epitaxial layer 7, the first p-type epitaxial layer 8, and the second p-type epitaxial layer 9 are subsequently formed in a consecutive manner. For a film formation process, an MOVPE process can be used for instance. TMG, SiH$_4$, NH$_3$, and bis (cyclopentadienyl) magnesium (Cp$_2$Mg) can be used as source gases. The use of a higher film-formation temperature than a film formation temperature in the bottom n-type epitaxial layer 5 as a growth condition further promotes c-axis growth. This obtains the outer side wall SO that is closer to be vertical than the side surface of the bottom n-type epitaxial layer 5 of trapezoidal shape. Through this step, the inner side wall SI forming the trench gate structure is formed without preforming dry-etching. Hence, the channel mobility is improved when compare to that through a step by using dry-etching.

It is noted that the n-type epitaxial portion 2, the bottom n-type epitaxial layer 5, and the side n-type epitaxial layer 7 function as drift layers for maintaining the withstand voltage. Hence, the thickness and dopant concentration of each layer are designed in accordance with necessary withstand voltage and necessary on-resistance. The n-type epitaxial portion 2 has a dopant concentration of $5 \times 10^{16}$ cm$^{-3}$ and a thickness of 3 μm, for instance. The bottom n-type epitaxial layer 5 has a dopant concentration of $2 \times 10^{16}$ cm$^{-3}$ and a thickness of 3 μm, for instance. The side n-type epitaxial layer has a dopant concentration of $8 \times 10^{15}$ cm$^{-3}$ and a thickness of 200 nm, for instance. Further, the first p-type epitaxial layer 8 functions as a channel layer. Hence, the first p-type epitaxial layer 8 preferably has low dopant concentration to a certain degree. For instance, its dopant concentration is $5 \times 10^{17}$ cm$^{-3}$ and its thickness is 500 nm. Further, the second p-type epitaxial layer functions as a contact layer, and thus preferably has as high an impurity concentration as possible. For instance, its dopant concentration is $1 \times 10^{20}$ cm$^{-3}$ and its thickness is 300 nm. It is noted that Be instead of Mg may be used as a p-type impurity.

Referring to FIG. 7, the filling layer 10 made of an insulator is next formed in order to fully fill the trenches formed by the outer side wall SO and the inner side wall SI. Spin-coating, which can obtain a large film thickness easily, or other techniques is suitable for a film formation process. A spin-on-glass (SOG) film, for instance, is used as a film species.

Referring further to FIG. 8, the second p-type epitaxial layer 9 (FIG. 7) formed on the top surface ST of the stack 51 is subsequently removed through chemical-mechanical polishing (CMP). The first p-type epitaxial layer 8 is thus exposed on the top surface ST. Colloidal silica is suitable for a polishing agent (slurry) in the CMP. GaN, which has higher hardness than SOG films, has an enormously low polishing rate. Thus, the polishing rate extremely drops down to about several tens of nanometers per hour as soon as a polishing pad reaches the second p-type epitaxial layer 9 as a result of the flattening of the filling layer 10. Hence, controlling etching time accurately to a certain degree enables the second p-type epitaxial layer 9 on the top surface ST to be exactly removed. It is noted that careful cleansing of the polished surface is highly important because the polished surface is contaminated after the CMP.

Figure 9:
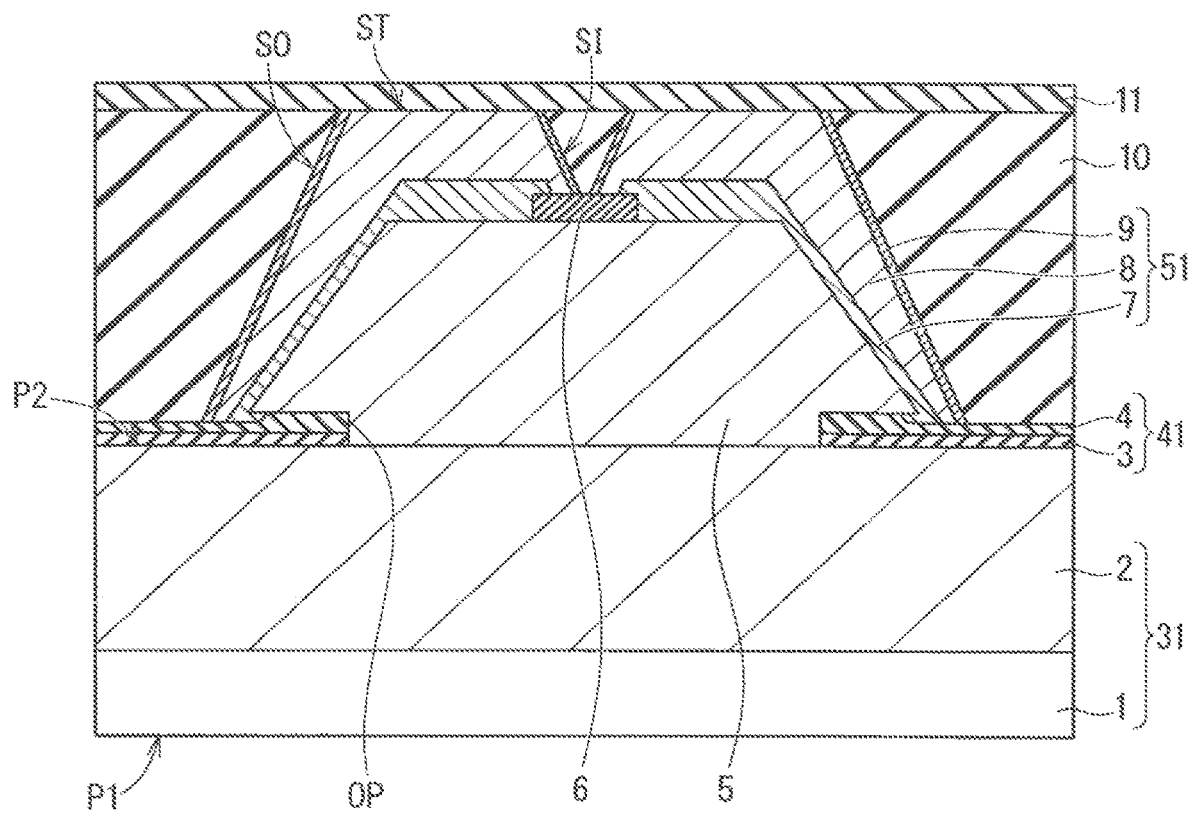
FIG. 9 is a schematic cross-sectional view of an eighth step in the method for manufacturing the semiconductor device in FIG. 1.

Referring to FIG. 9, an insulating film 11 is subsequently formed on the top surface ST and the filling layer 10 around the top surface ST as a surface protection film for ion implantation. For instance, a SiN film having a thickness of about 30 nm is formed through a sputtering process.

Referring to FIG. 10, the n-type contact layer 12 is subsequently formed on the top surface ST through Si-ion implantation. The n-type contact layer 12, which functions as a contact layer, is preferably doped at a high concentration. An implantation condition includes, for instance, a tilt angle of about seven degrees, an implantation energy level of about 20 keV to 200 keV, and an implantation dose of about $1 \times 10^{14}$ cm$^{-2}$ to $1 \times 10^{15}$ cm$^{-2}$. Ion implantation into GaN produces a crystal defect of a donor type. Hence, p-type GaN, which is prone to carrier compensation effect, is difficult to form through the implantation. However, n-type GaN is successfully formed through the implantation. It is noted that a plurality of times of implantation may be performed along with different levels of energy in order to establish a flat impurity profile. Subsequently, a dopant undergoes heating at a temperature of about 1100° C. to 1200° C. for activation. Consequently, the crystal defect is repaired to a certain degree. In addition, impurities are placed in a lattice position, thereby reducing the resistance of the n-type contact layer 12.

Figure 11:
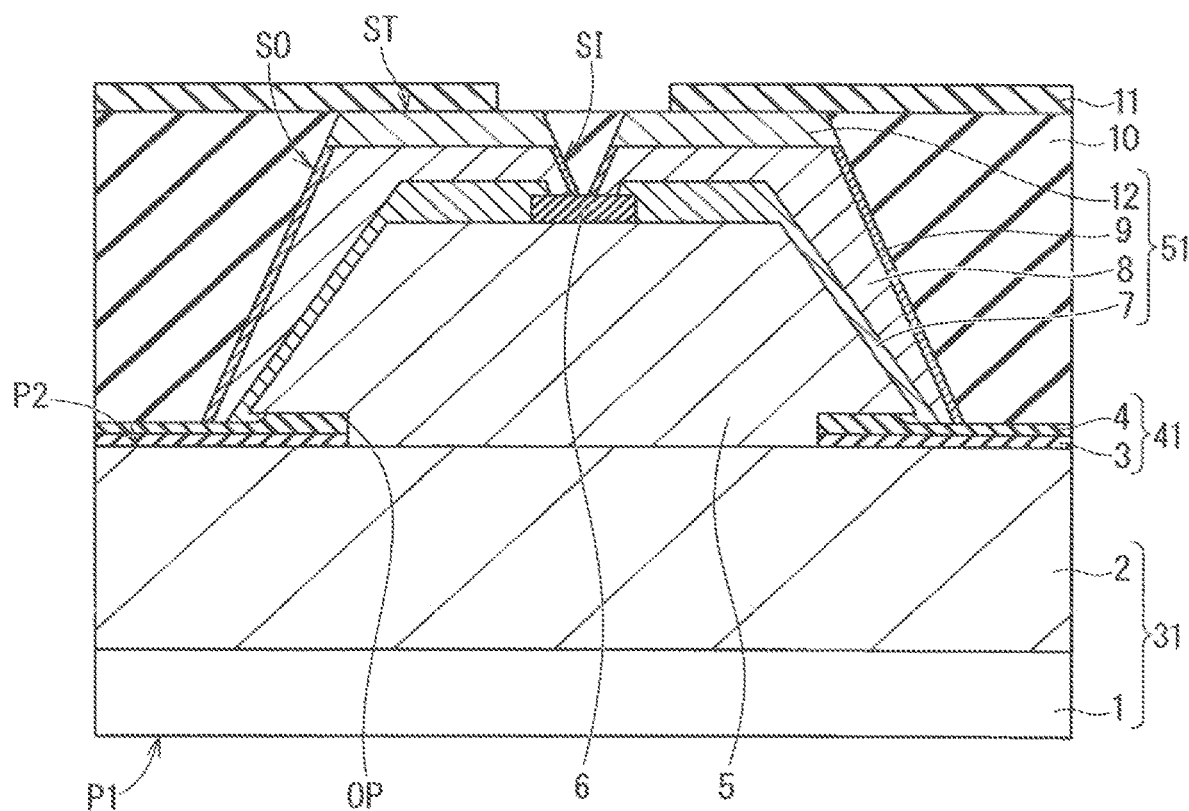
FIG. 11 is a schematic cross-sectional view of a tenth step in the method for manufacturing the semiconductor device in FIG. 1.

Referring to FIG. 11, an opening exposing a portion of the filling layer 10, the portion being embedded in the inner trench, is subsequently formed in the insulating film 11 in order to selectively remove this portion. The opening can be formed through photolithography and dry-etching, such as reactive ion etching (RIE). A resist pattern (not shown) formed through the photolithography is removed through organic cleansing after the etching process is completed.

Referring further to FIG. 12, the filling layer 10 (FIG. 11) within the inner trench is removed through wet-etching using the insulating film 11, having the opening, as a hard mask. In the present embodiment, the filling layer 10 has been formed of an SOG film. Accordingly, a hydrofluoric acid is used as an etchant.

Referring further to FIG. 13, the portion (FIG. 12) of the second p-type epitaxial layer 9, the portion being on the top surface ST, is subsequently removed through wet-etching with a KOH solution. As earlier mentioned, a site with a crystal defect on a substrate can cause the etching rate in the site to be high, thereby making etching control difficult. However, this process, in which the second insulating layer 6 serves as an etching stopper, prevents excessive etching progress in a longitudinal direction of the substrate. This improves the yield of etching. Further, the channel is formed not by the second p-type epitaxial layer 9, but by the first p-type epitaxial layer 8 having lower impurity concentration. This reduces effects of the Coulomb scattering in the channel, thereby improving the channel mobility. Further, the aforementioned etching produces a round corner at the upper part of the inner trench. This lessens the concentration of the electric field in this location.

Referring to FIG. 14, an insulating film 13 is subsequently formed, which is to be a hard mask in the etching for removing the filling layer 10 within the outer trench with the second insulating layer 6 at the bottom of the inner trench left intact. The insulating film 13 is preferably resistant to a hydrofluoric acid. An example of the insulating film 13 is a SiN film. Its thickness of about 100 nm is sufficient.

Referring to FIG. 15, a resist mask (not shown) is subsequently formed through photolithography. The insulating film 13 and the insulating film 11 undergoes patterning through dry-etching, such as RIE using this resist mask. The resist mask is then removed through a process, such as organic cleansing. Consequently, the filling layer 10 within the outer trench is exposed.

Referring further to FIG. 16, the filling layer 10 (FIG. 15) within the outer trench is subsequently removed using the insulating film 13 and the insulating film 11 as hard masks. In the present embodiment, the filling layer 10 has been formed of an SOG film. Accordingly, a hydrofluoric acid is used as an etchant.

Figure 17:
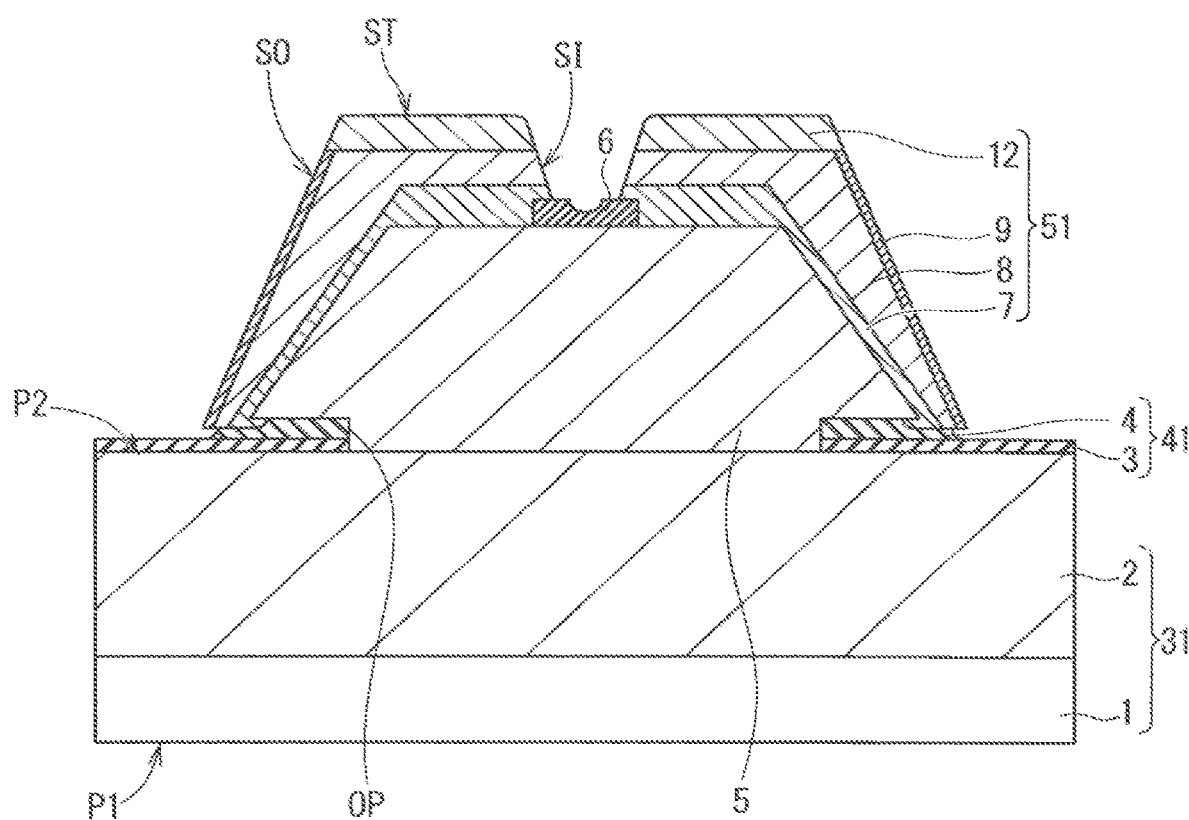
FIG. 17 is a schematic cross-sectional view of a sixteenth step in the method for manufacturing the semiconductor device in FIG. 1.

Referring further to FIG. 17, the insulating film 13 and the insulating film 11, which have been used as the hard masks, are subsequently removed through etching. In the present embodiment, the insulating film 13 and the insulating film 11 have been formed of SiN films. Accordingly, a hot phosphoric acid is used as an etchant.

A p-type GaN region constituting the stack 51, i.e., the first p-type epitaxial layer 8 and the second p-type epitaxial layer 9 next undergoes annealing for hydrogen removal. The p-type GaN has been terminated under the influence of a hydrogen-based gas used in epitaxial growth to be inactivated. Hence, annealing for hydrogen removal is required in order to obtain an active p-type GaN. If another film were stacked on the p-type GaN region, hydrogen detachment could be hindered. In the present embodiment, a portion of the first p-type epitaxial layer 8, the portion constituting a channel, is exposed in the inner trench in the annealing. Moreover, the second p-type epitaxial layer 9 used for contact is exposed in the outer trench. This facilitates the detachment of hydrogen from the p-type GaN region. Consequently, sufficient activation is easily achieved. For the annealing for activation, a heating process is performed at a temperature of 700° C. in an atmosphere of nitrogen for 20 minutes. More preferably, a heating process in an atmosphere of pressurized nitrogen prevents thermal decomposition of the GaN, thereby reducing possible formation of carriers of a donor type. This enables a heating process for activation at a higher temperature, thereby increasing the activation rate of the p-type GaN.

Referring to FIG. 18, the source electrode portion 14 is subsequently formed through, for instance, a lift-off process. For a material of the source electrode portion 14, a stacked film made of metals, such as titanium (Ti), aluminum (Al), platinum (Pt), niobium (Nb), molybdenum (Mo), nickel (Ni), palladium (Pd), indium (In), and gold (Au) can be used. An electron-beam (EB) deposition process or a sputtering process can be used as a film formation process. It is noted that the uppermost layer of the stacked film is subjected to a buffered hydrofluoric acid in a subsequent process. Hence, the uppermost layer is preferably resistant to a hydrofluoric acid. An example of the uppermost layer is an Au layer. Moreover, the following layers may be used as lowermost layers that are in contact with the GaN in order to reduce contact resistance: for the n-type GaN, a layer made of a metal having a low work function; and for the p-type GaN, a layer made of a metal having a high work function. Alternatively, to reduce steps, a metal layer made of a single material may be used as a lowermost layer as illustrated in the drawing, thereby establishing contact with both the n-type GaN and the p-type GaN. An unnecessary portion is removed through lift-off after the aforementioned film is formed. Moreover, the drain electrode 15 is formed also on the lower surface P1 of the epitaxial substrate 31 with a similar stacked film. Next, heating at a temperature of about 750° C. establishes an ohmic junction between the source electrode portion 14 and the drain electrode 15.

It is noted that an optimal annealing temperature for establishing the ohmic junction tends to be lower for the p-type GaN than for the n-type GaN. Accordingly, contact electrode formation for the p-type GaN and annealing at a temperature of about 450° C. may be performed after contact electrode formation for the n-type GaN and annealing at a temperature of about 750° C. This complicates manufacture processes, but achieves further low contact resistance.

Referring to FIG. 19, organic cleansing is preferably performed after the aforementioned formation of the ohmic electrode. The gate insulating film 16 is subsequently formed. The gate insulating film 16 preferably sustains minimum film-formation damage and has high quality. Accordingly, a process, such as a remote plasma CVD process, an atomic layer deposition (ALD) process, or an electron cyclotron resonance (ECR) sputtering process can be used. It is noted that hydrogen from a film-formation gas can inactivate the channel made of the p-type GaN again when a film-formation temperature gets high in the formation of the gate insulating film using a CVD apparatus. Hence, high-temperature heating is preferably avoided when a CVD film is used. Further preferably, the gate insulating film 16 may have a lowermost layer formed of a CVD film and an upper layer formed of a sputtering film in order to achieve a reduction in hydrogen effect, a reduction in film-formation damage, and an improvement in quality of the insulating film.

The gate insulating film 16 is desirably made of a material having a sufficient band offset with respect to the GaN. Examples of such a material include alumina ($Al_2O_3$) and $SiO_2$. For instance, an $Al_2O_3$ film having a thickness of 20 nm is formed as the gate insulating film 16. To improve coverage, an ALD process is a suitable formation process. A stacked film containing $Al_2O_3$, a $SiO_2$ monolayer film, or a stacked film containing $SiO_2$ may be used instead of the $Al_2O_3$ monolayer film. Moreover, a film made of a material with a high dielectric constant (High-k) may be used in combination in order to increase the capacity of the insulating film and reduce a leak current. One example of the High-k material is $HfO_2$.

Referring to FIG. 20, the metal pattern portion 17 is subsequently formed through a lift-off process. To be specific, a resist mask for lift-off is formed through photolithography. A metal material constituting the metal pattern portion 17 is subsequently deposited. This material needs to be selected in accordance with, for instance, a desired threshold voltage and desired gate resistance. An example of such a material is a stacked film of Ni and Au. An unnecessary portion of the deposited film is subsequently removed through lift-off.

Here, being thin, the metal pattern portion 17 involves high gate resistance, thereby possibly having unfavorable effect on device characteristics. On the other hand, being thick, the metal pattern portion 17 tends to make the lift-off step difficult.

Referring to FIG. 21, in order to avoid the aforementioned trade-off relating to the thickness, the plating portion 18 may be formed on the metal pattern portion 17 through an electric-field plating process after the metal pattern portion 17 is formed. Consequently, a sufficiently thick gate electrode 61 is formed with high yield of steps. Copper or Au, for instance, is suitable for a material of the plating portion 18. Its thickness is preferably large enough to fill the inner trench, and is about 500 nm for instance. It is noted that the material of the gate electrode 61 is not limited to metal, and may be polycrystalline Si (Poly-Si) for instance. Such an electrode can be formed by forming a polycrystalline Si film and removing an unnecessary portion through etchback.

Figure 22:
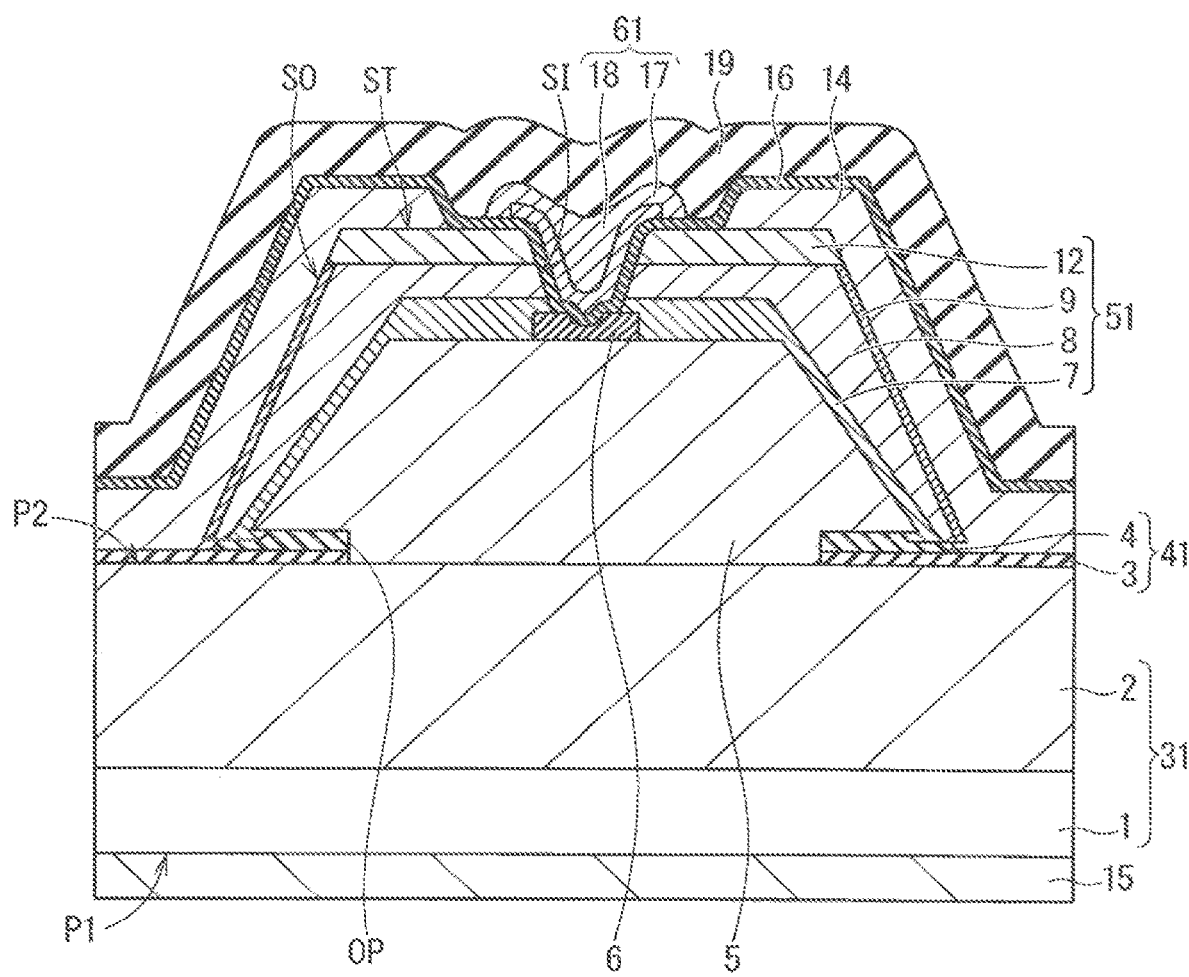
FIG. 22 is a schematic cross-sectional view of a twenty-first step in the method for manufacturing the semiconductor device in FIG. 1.

Referring to FIG. 22, the interlayer insulating film 19 is subsequently formed. As earlier mentioned, a film formation process without hydrogen is preferable. For instance, a SiN film is formed through a sputtering process. At this time, high film formation pressure enhances conformality, which enables the interlayer insulating film 19 to be formed without voids even on an uneven portion.

Figure 23:
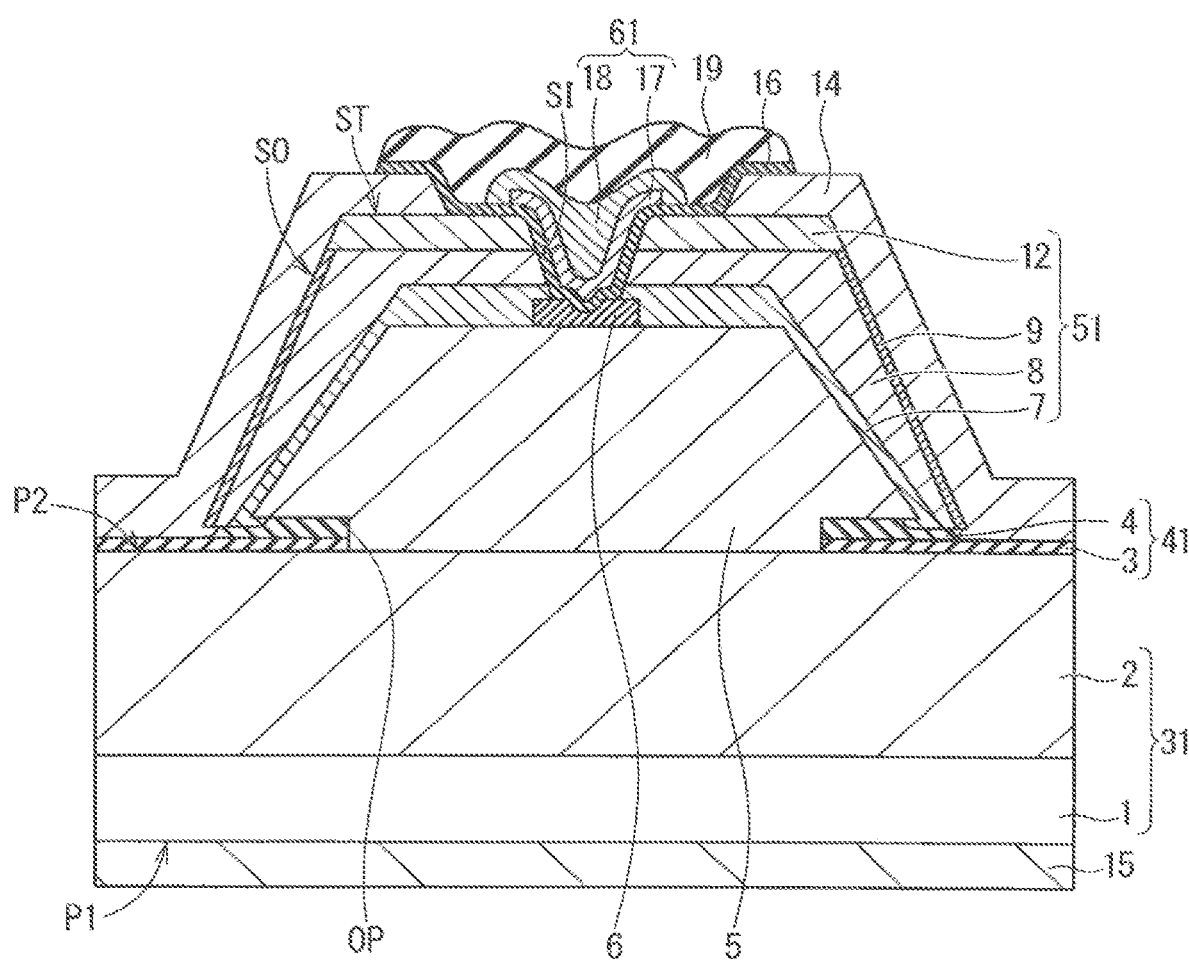
FIG. 23 is a schematic cross-sectional view of a twenty-second step in the method for manufacturing the semiconductor device in FIG. 1.

Referring to FIG. 23, of the interlayer insulating film 19, while a portion covering gate electrode 61 is retained, the other portion is subsequently removed through photolithography and etching with a buffered hydrofluoric acid. A resist pattern (not shown) formed through the photolithography is removed through organic cleansing after the etching step is completed.

Figure 24:
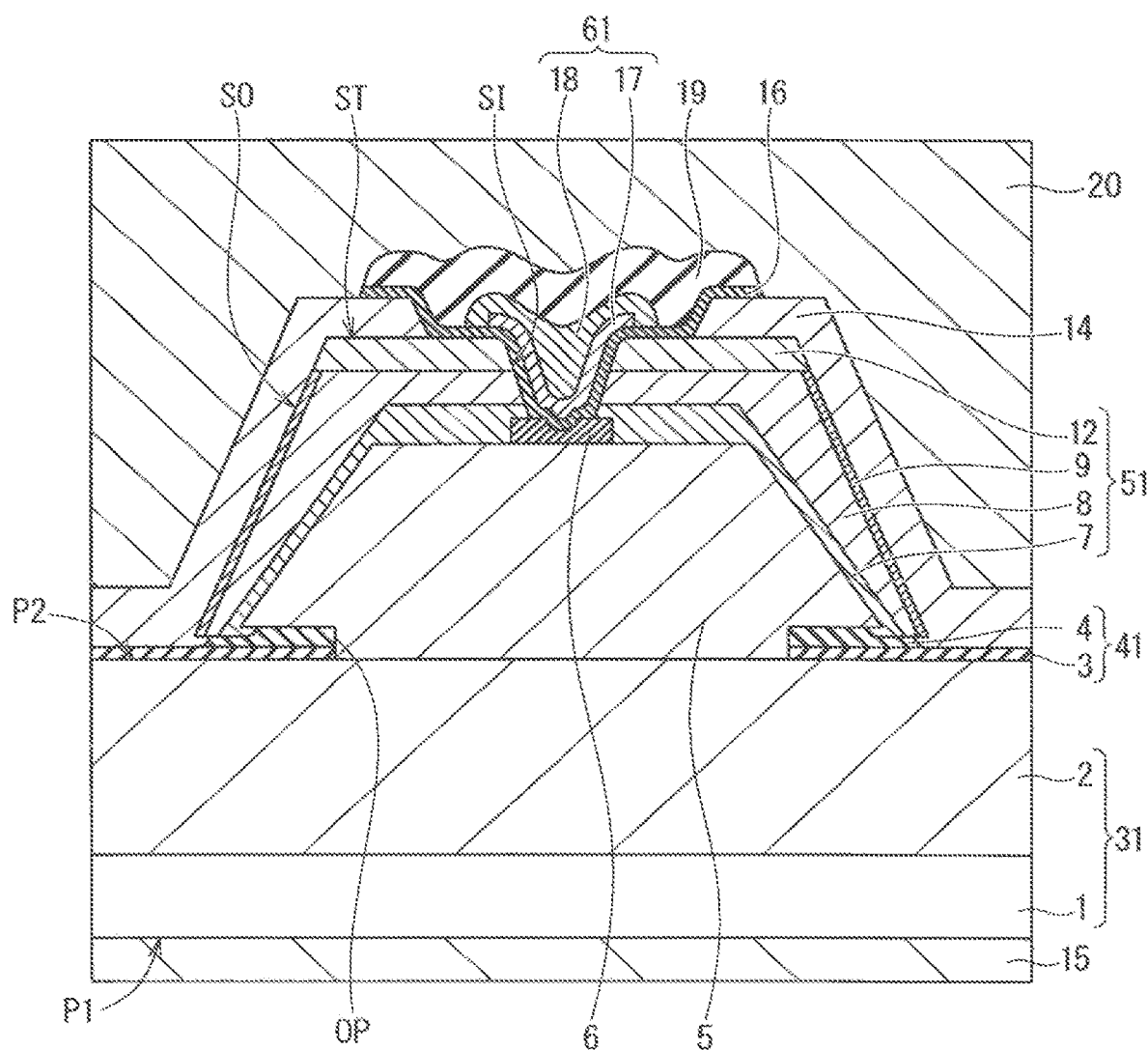
FIG. 24 is a schematic cross-sectional view of a twenty-third step in the method for manufacturing the semiconductor device in FIG. 1.

Referring to FIG. 24, the cover electrode layer 20 is subsequently formed through an electric-field plating process. This step may be replaced with the formation of an aluminum silicon (AlSi) film and a reflowing process for flattening. Through the processes described above, the MOSFET 91 (FIG. 1) is obtained.

Figure 25:
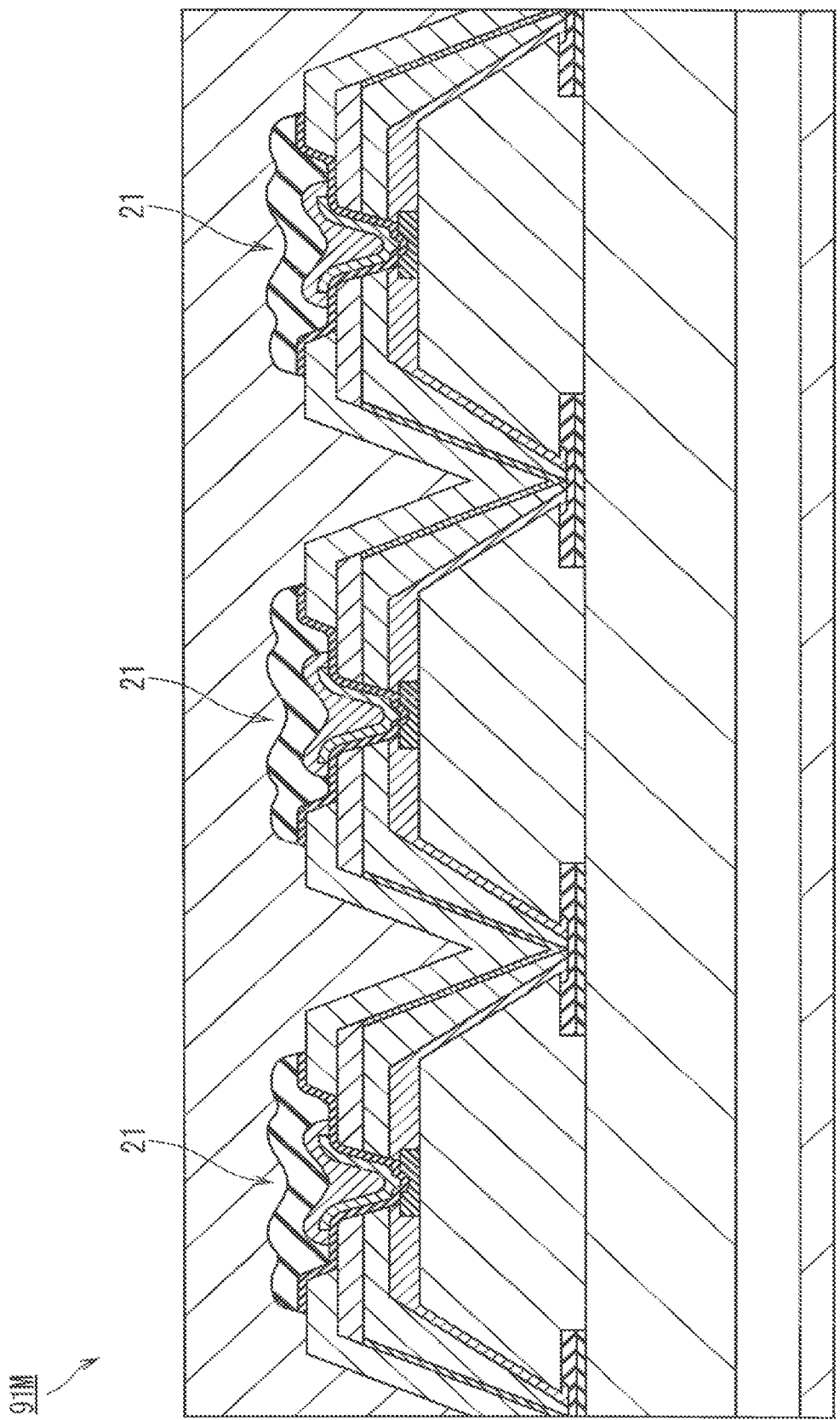
FIG. 25 is a diagram illustrating a modification of the configuration of the semiconductor device in FIG. 1, and is a cross-sectional view taken along line XXV-XXV in FIG. 26.
Figure 26:
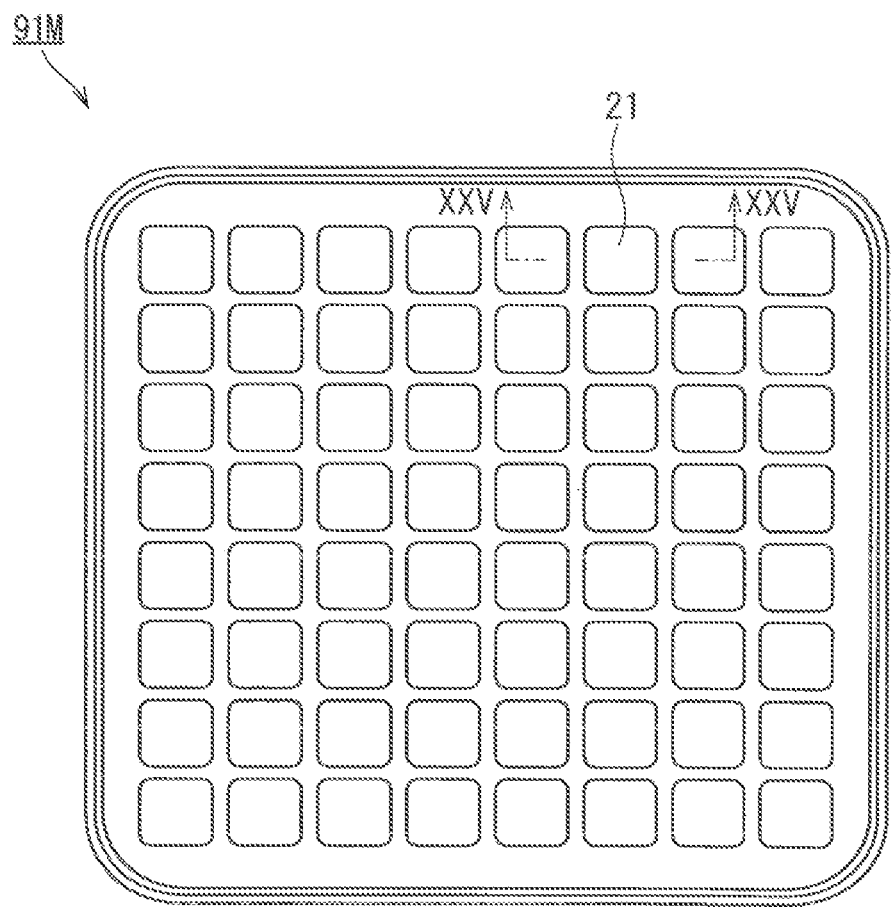
FIG. 26 is a plan view of the modification of the configuration of the semiconductor device in FIG. 1.

It is noted that referring to FIGS. 25 and 26, a plurality of MOS minimum units 21 each having a structure of the MOSFET 91 (FIG. 1) may be arranged. This obtains an MOSFET (semiconductor device) 91M having lower channel resistance.

According to the present embodiment, semiconductor layers of different kinds or with different impurity concentrations are formed on each of the outer side wall SO, the top surface ST, and the inner side wall SI without process damage on the p-type GaN. This avoids the problem for the p-type GaN of the carrier-compensation effect caused by the process damage. To be specific, a highly active p+ layer is formed on the outer side wall SO not through ion implantation of a p-type impurity, but through epitaxial growth of the p-type GaN. Consequently, favorable ohmic contact with the p-type GaN is established easily. This enables efficient retrieval of the holes that are generated by an ionizing collision during high-voltage application and then enter the p-type GaN. This prevents a rise in body potential of the p-type GaN. Consequently, the avalanche strength (latch-up resistance) is greatly enhanced when compared to a conventional structure.

The outer trench has a forward taper shape tapering downward. In other words, the stack 51 has a reverse taper shape tapering downward. Hence, the extension of electrons flowing toward the epitaxial substrate 31 after passing through a channel, region is less hindered by the outer trench. This provides a structure suitable for high current while providing the outer trench.

The second p-type epitaxial layer 9, i.e., a contact region of the p-type GaN, is not placed in parallel with the epitaxial substrate 31, but placed to be inclined. This reduces the contact region of the p-type GaN occupied in an active area of the MOSFET 91. This leads to an increase in area of a region of the n-type GaN occupied in the active area, i.e., a source region. This also leads to a reduction in resistance of the contact of the source electrode with the n-type GaN. This reduces the on-resistance per unit area.

In the step in FIG. 17, unlike the case in which the n-type GaN layer is stacked on the p-type GaN layer in a planar manner, the annealing for activation is performed with the p-type GaN exposed in a channel portion and a contact portion. Consequently, the detachment of hydrogen from the p-type GaN is not hindered during the annealing for activation. This enables the p-type GaN to be sufficiently activated. Consequently, channel resistance is reduced; in addition, the resistance of contact with the p-type GaN is reduced. These effects contribute to a reduction, in on-resistance and an improvement in withstand voltage.

The inner trench and the outer trench are formed not through, dry-etching after epitaxial growth, but formed at the time of selective epitaxial growth. This reduces crystal damage in the channel portion. Consequently, a scatter phenomenon in the channel is prevented. This achieves high channel mobility.

The depletion layer extending from the p-type GaN of the outer trench lessens the concentration of the electric field at the lower part of the inner trench. This enhances the withstand voltage.

As illustrated in FIGS. 12 and 13, p+GaN on the side surface of the inner trench is removed through wet-etching with p+GaN on the side surface of the outer trench protected. This enables the dopant concentration of each of the contact region and the channel region to be individually controlled with respect to the p-type GaN. Consequently, both high channel mobility and low resistance of contact with the p-type GaN are achieved. As a result, the on-resistance is reduced; in addition, the avalanche strength is improved.

Second Embodiment

Figure 27:
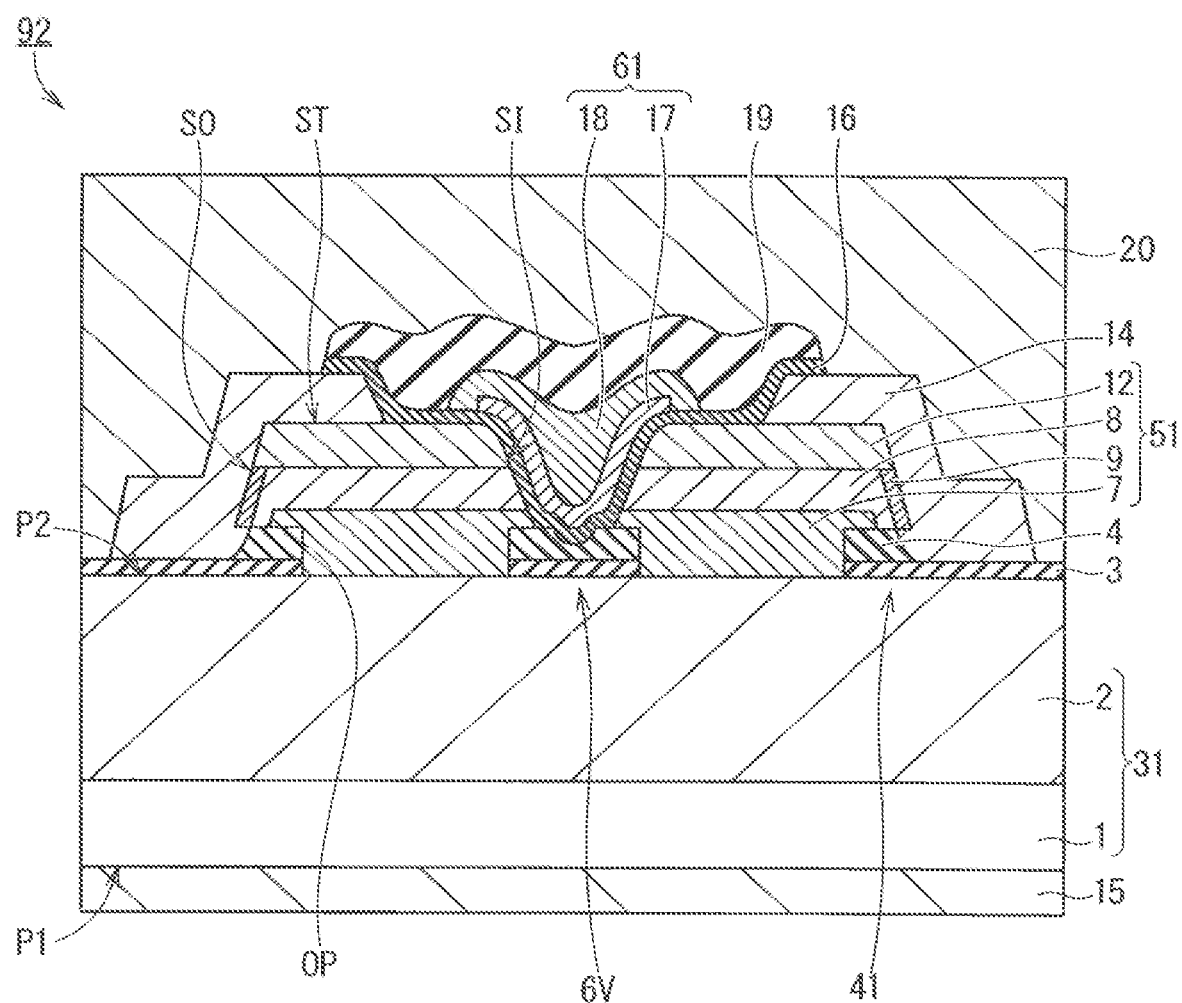
FIG. 27 is a schematic cross-sectional view of a configuration of a semiconductor device in a second embodiment of the present invention.

FIG. 27 is a schematic cross-sectional view of a configuration of a MOSFET (semiconductor device) 92 in a second embodiment. The MOSFET 91 (FIG. 1: the first embodiment) is configured such that an epitaxial growth layer tends to have a large total thickness. This tendency is advantageous to obtain high withstand voltage, but involves high resistance of the drift layer, thereby easily increasing the on-resistance. Accordingly, when a low on-resistance is a high priority, provided is a possible configuration in which the bottom n-type epitaxial layer 5 of the MOSFET 91 is omitted, like the MOSFET 92, to reduce the resistance of the drift layer. This reduces the on-resistance.

In a method for manufacturing the MOSFET 92, a process of forming the bottom n-type epitaxial layer 5 (FIG. 3) is omitted. This simplifies a process. Further, as a result of this omission, a step of forming a second insulating layer 6V (FIG. 27) can be performed at the same time as the step of forming the first insulating layer 41 (FIG. 2: the first embodiment) instead of the step of forming the second insulating layer 6 (FIGS. 4 and 5: the first embodiment). This further simplifies the process. It is noted that the second insulating layer 6V is made of the same material as that of the first insulating layer 41 in this case. In the example of FIG. 27, the first insulating layer 41 and the second insulating layer 6V are each formed of a stack of the first insulating film 3 and the second insulating film 4.

It is noted that configurations other than those described above are almost the same as those in the first embodiment, and that the same or corresponding components are denoted by the same symbols and will not be thus elaborated upon here.

According to the present embodiment, provided are effects that are almost similar to those in the first embodiment except slightly less enhancement of the withstand voltage. Moreover, a lower on-resistance is achieved as earlier mentioned.

Third Embodiment

Summary of Configuration

Figure 28:
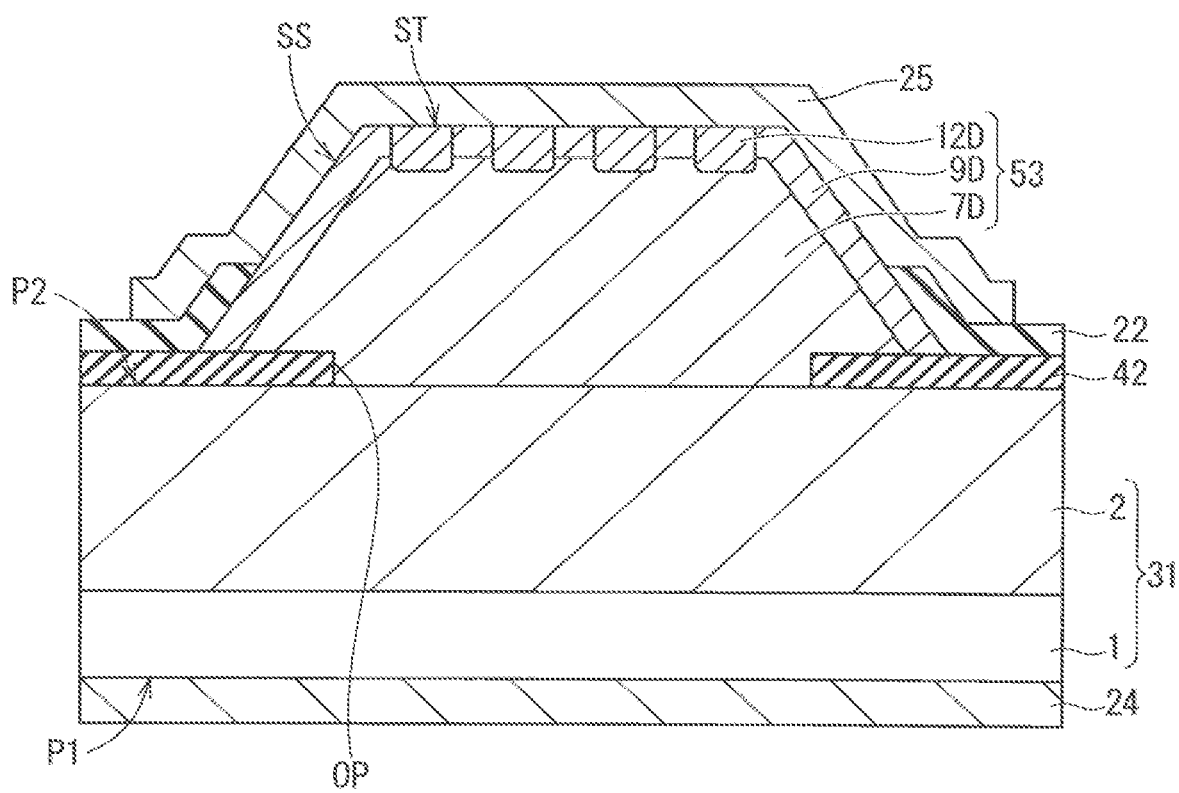
FIG. 28 is a schematic cross-sectional view of a configuration of a semiconductor device in a third embodiment of the present invention.

FIG. 28 is a schematic cross-sectional view of a configuration of a semiconductor device (diode) 93 in a third embodiment. The following item (1) summarizes the configuration of the semiconductor device 93.

(1) The semiconductor device 93 includes a semiconductor substrate (epitaxial substrate) 31, an insulating layer 42, a stack 53, an n-type barrier Layer 12D, an anode electrode 25, and a cathode electrode 24. The semiconductor substrate 31 has a first surface (lower surface) P1 and a second surface P2 (upper surface) opposite the first surface P1. The insulating layer 42 is disposed on the second surface P2 of the semiconductor substrate 31, and has an opening OP partly exposing the second surface P2. The stack 53 includes an n-type epitaxial layer 7D and a p-type epitaxial layer 9D in sequence on the second surface P2 of the semiconductor substrate 31. The n-type epitaxial layer 7D and the p-type epitaxial layer 9D are made of a gallium-nitride-based material. The stack 53 has the following: a side wall SS extending from the insulating layer 42 and forming a smaller angle than a right angle together with the second surface P2 of the semiconductor substrate 31; and a top surface ST joined to the side wall SS. The n-type barrier layer 12D is partly disposed on the top surface ST of the stack 53, and is in contact with the n-type epitaxial layer 7D. The anode electrode 25 is in contact with the p-type epitaxial layer 9D and the n-type barrier layer 12D on the top surface ST of the stack 53, and is in contact with the p-type epitaxial layer 9D on the side wall SS of the stack 53. The cathode electrode 24 is disposed on the first surface P1.

The p-type epitaxial layer 9D is thus disposed not only on the top surface ST of the stack 53, but also on the side wall SS of the stack 53. Accordingly, a pn junction is established not only in the vicinity of the top surface ST, but also in the vicinity of the side wall SS. A depletion layer extending from the pn junction in the vicinity of the side wall SS into the n-type epitaxial layer 7D lessens an electric field at a Schottky interface between the n-type barrier layer 12D and the anode electrode 25. This enhances the reverse withstand voltage of the semiconductor device 93. Further, the p-type epitaxial layer 9D is not a p-type layer formed through ion implantation, but an epitaxial layer. The second p-type epitaxial layer 9 thus has high activity while being a p-type gallium-nitride-based material. This further sufficiently achieves the aforementioned effect.

In addition, the insulating layer 42 is disposed at the lower end of the side wall SS of the stack 53. Consequently, the concentration of the electric field at the lower end of the side wall SS of the stack 53 is lessened. This enhances the withstand voltage of the semiconductor device 93.

Summary of Manufacture Method

FIGS. 29 to 35 schematically illustrate, step-by-step, a method for manufacturing the semiconductor device (diode) 93 in the present embodiment. The following items (2) and (3) summarize the method for manufacturing the semiconductor device 93.

Figure 29:
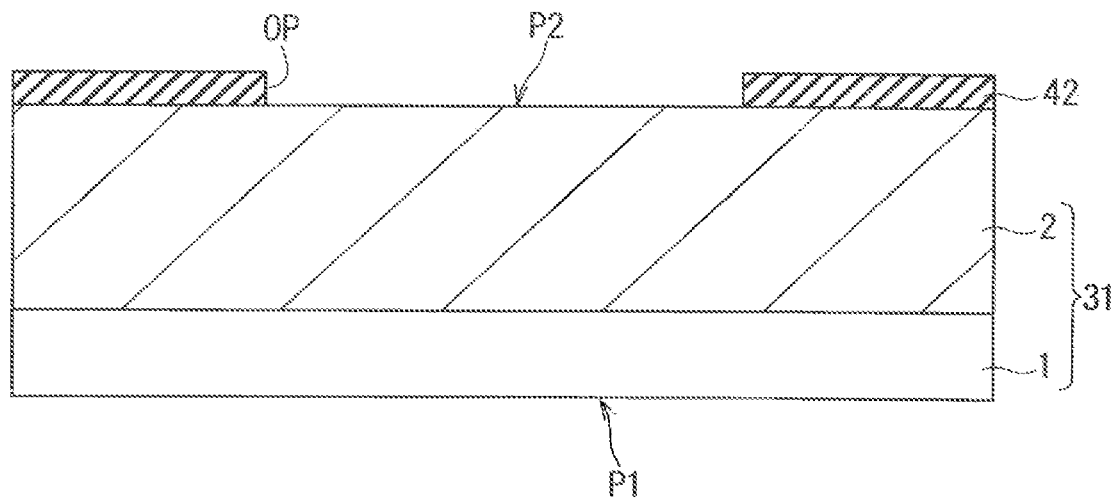
FIG. 29 is a schematic cross-sectional view of a first step in a method for manufacturing the semiconductor device in FIG. 27.
Figure 30:
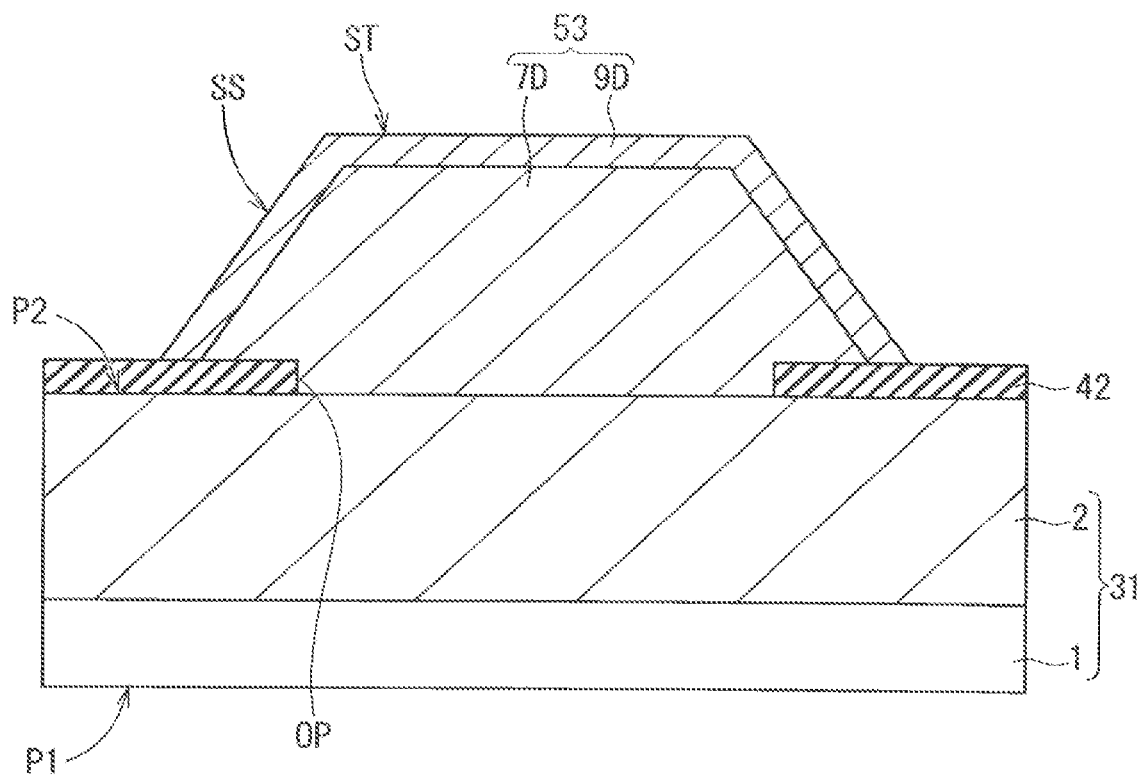
FIG. 30 is a schematic cross-sectional view of a second step in the method for manufacturing the semiconductor device in FIG. 27.
Figure 32:
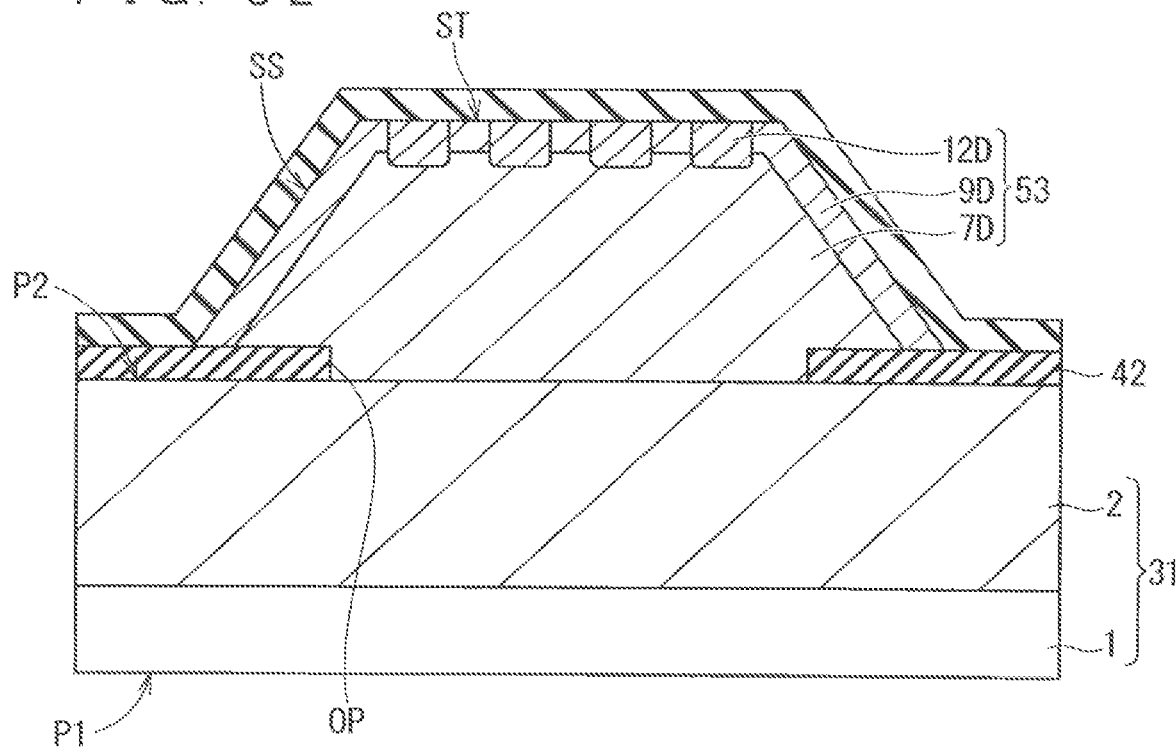
FIG. 32 is a schematic cross-sectional view of a fourth step in the method for manufacturing the semiconductor device in FIG. 27.
Figure 35:
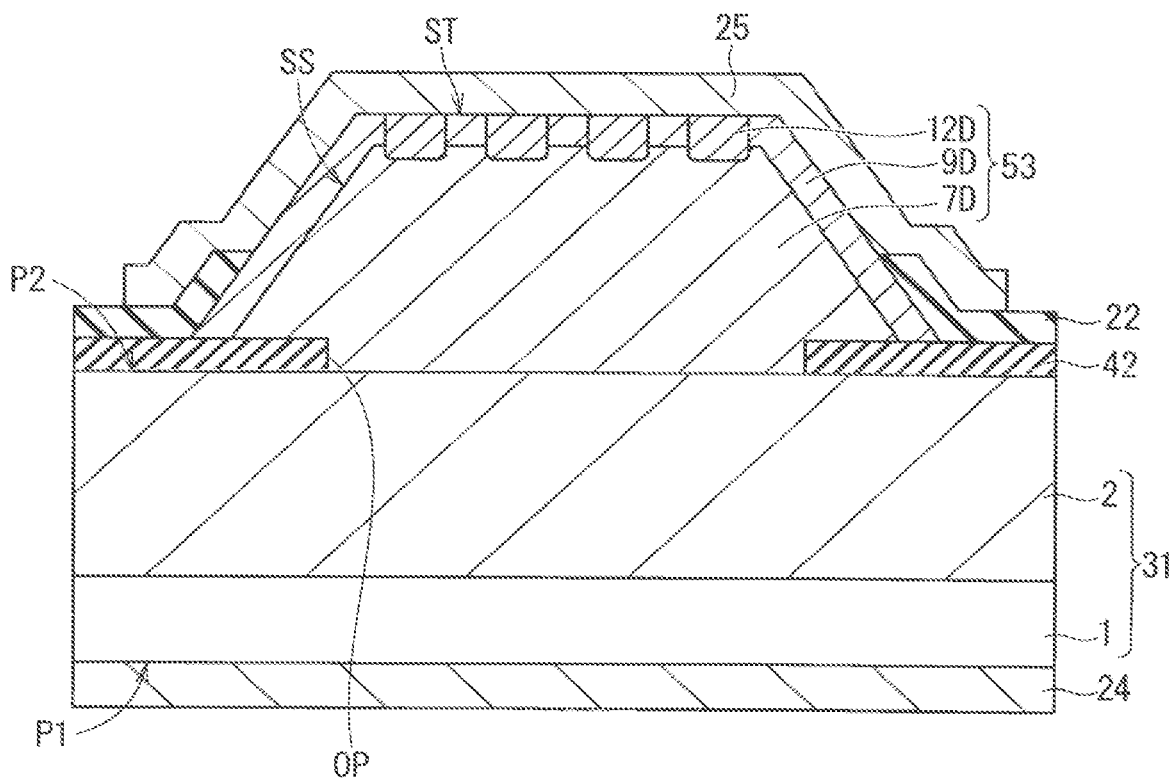
FIG. 35 is a schematic cross-sectional view of a seventh step in the method for manufacturing the semiconductor device in FIG. 27.

(2) The method for manufacturing the semiconductor device 93 includes the following steps. Referring to FIG. 29, the semiconductor substrate 31, which has the first surface (lower surface) P1 and the second surface (upper surface) P2 opposite the first surface P1, is prepared. The insulating layer 42, which has the opening OP partly exposing the second surface P2, is formed on the second surface P2 of the semiconductor substrate 31. Referring to FIG. 30, the gallium-nitride-based material undergoes selective epitaxial-growth on the second surface P2 of the semiconductor substrate 31 using the insulating layer 42 as a growth mask. Thus, the n-type epitaxial layer 7D and the p-type epitaxial layer 9D are deposited in sequence. This forms the stack 53 having the side wall SS, which extends from the insulating layer 42 and forms a smaller angle than a right angle together with the second surface P2 of the semiconductor substrate 31, and the top surface ST, which is joined to the side wall SS. Referring to FIG. 32, the n-type barrier layer 12D in contact with the n-type epitaxial layer 7D is partly formed on the top surface ST of the stack 53. Referring to FIG. 35, the anode electrode 25, which is in contact with the p-type epitaxial layer 9D and the n-type barrier layer 12D on the top surface ST of the stack 53 and is in contact with the p-type epitaxial layer 9D on the side wall SS of the stack 53, is formed. The cathode electrode 24 is formed on the first surface P1.

This achieves an effect similar to that described in item (1).

(3) Referring to FIG. 32, the n-type barrier layer 12D is formed through donor impurity implantation onto the top surface ST of the stack 53.

This facilitates the formation of the n-type barrier layer 12D on the top surface ST of the stack 53 when compared to formation through a deposition process. Further, for gallium-nitride-based materials, commonly, it is difficult to achieve sufficient activity in the formation of a p-type implanted layer through acceptor impurity implantation but it is easy to achieve sufficient activity in the formation of an n-type implanted layer through donor impurity implantation. A layer formed through an implantation process is the n-type barrier layer 12D; sufficient activity is, thus, achieved while using the implantation process.

Details

Although overlapping the foregoing, the following describes the MOSFET 93 in a more concrete manner. It is noted that the following specific materials, specific impurity concentrations, and specific manufacture conditions are preferable examples, and thus do not exclude any other aspects.

Referring to FIG. 28, the diode 93 is a vertical Schottky barrier diode (SBD) having a Merged pin Schottky (MPS) structure. Forming the diode by applying the processes for manufacturing the MOSFET in the first embodiment achieves high withstand voltage.

The epitaxial substrate 31 is almost similar to that in FIG. 1 (first embodiment). The insulating layer 42, which has the opening OP similar to that of the first insulating layer 41 (FIG. 1: the first embodiment), is disposed on the upper surface P2 of the epitaxial substrate 31. Further, the stack 53 made of a GaN-based material and having a mesa shape is disposed on the upper surface P2 with the insulating layer 42 partly interposed therebetween. To be specific, an n-type GaN epitaxial layer that is the n-type epitaxial layer 7D, and a p-type GaN epitaxial layer that is the p-type epitaxial layer 9D are disposed in sequence. The n-type barrier layer 12D formed by partly reversing the conductivity type of the p-type epitaxial layer 9D through Si implantation is disposed at the upper part of a trapezoidal shape of the stack 53, i.e., on the top surface of the stack 53.

An insulating film 22 is disposed around the stack 53 on the upper surface P2 provided with the insulating layer 42. The insulating film 22 has an opening exposing part of the side wall SS of the stack 53 and exposing the top surface ST. The anode electrode 25 is disposed on the stack 53 with the insulating film 22 partly interposed therebetween. Further, the cathode electrode 24 is disposed on the lower surface P1 of the epitaxial substrate 31.

It is noted that an n-type epitaxial portion 2 is doped with Si at about $1 \times 10^{18}$ cm$^{-3}$, that the n-type epitaxial layer 7D is doped with Si at about $1 \times 10^{17}$ cm$^{-3}$, and that the p-type epitaxial layer 9D is doped with Mg at about $5 \times 10^{17}$ cm$^{-3}$. The dopant concentration of Si implanted to the upper part of the mesa for forming the n-type barrier layer 12D is about $6 \times 10^{17}$ cm$^{-3}$. The layers each have the following thickness for instance: the n-type epitaxial portion 2 has a thickness of 2 μm; the n-type epitaxial layer 7D has a thickness of 5 μm; and the p-type epitaxial layer 9D has a thickness of 500 nm.

The following describes a method for manufacturing the diode 93.

Referring to FIG. 29, the n-type epitaxial portion 2 is formed on an n-type monocrystal substrate 1 in a manner similar to that in the first embodiment. The dopant concentration is $1 \times 10^{18}$ cm$^{-3}$ for instance. The thickness is about 2 μm for instance. The insulating layer 42 is subsequently formed on the n-type epitaxial portion 2. For instance, a SiN film having a thickness of about 100 nm is formed as the insulating layer 42. The insulating layer 42 subsequently undergoes patterning through wet-etching with, for instance, a buffered hydrofluoric acid. This forms the opening OP in the insulating layer 42.

Referring to FIG. 30, GaN is selectively grown through a process, such as a MOVPE process again using the insulating layer 42 as a mask for selective growth. Temperature and pressure control during the film formation forms the stack 53 having a trapezoidal shape while consecutively growing the n-type epitaxial layer 7D and the p-type epitaxial layer 9D. The n-type epitaxial layer 7D has a dopant concentration of about $1 \times 10^{17}$ cm$^{-3}$ and a thickness of about 5 μm for instance. The p-type epitaxial layer 9D has a dopant concentration of about $5 \times 10^{17}$ cm$^{-3}$ and a thickness of about 500 nm for instance.

Figure 31:
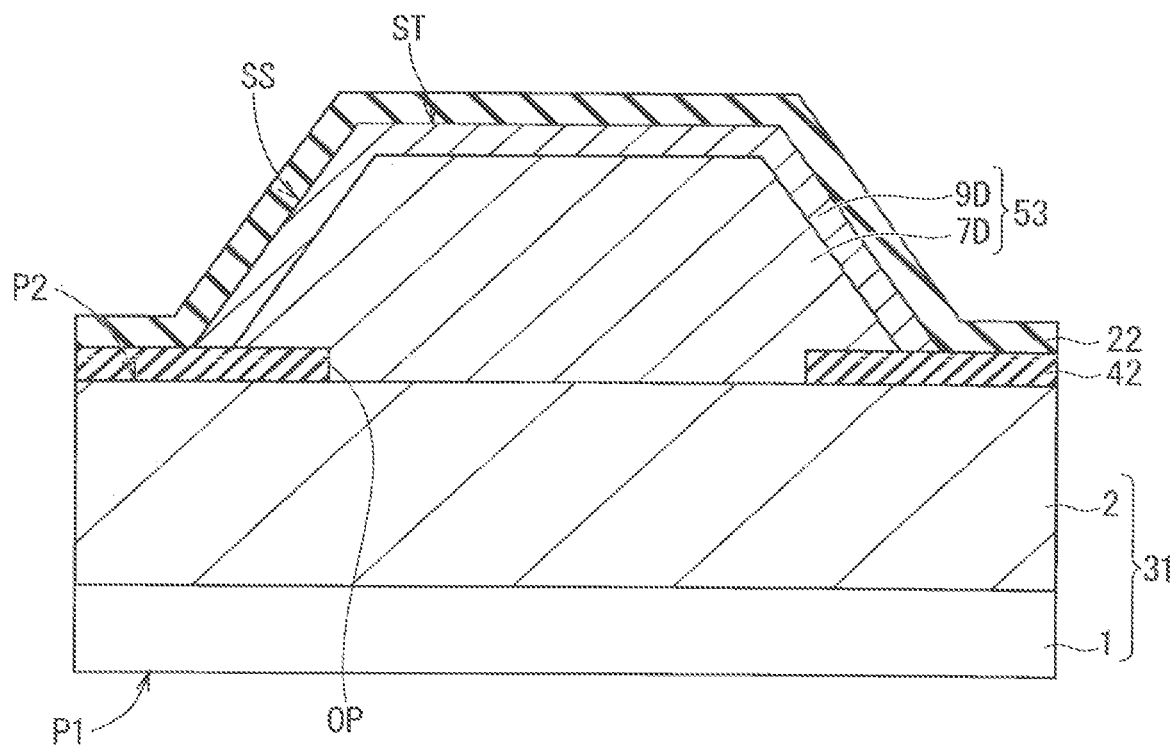
FIG. 31 is a schematic cross-sectional view of a third step in the method for manufacturing the semiconductor device in FIG. 27.

Referring to FIG. 31, the insulating film 22 is formed as a protective film for ion implantation. For instance, a SiN film having a thickness of 100 nm is formed through a sputtering process or a CVD process.

Referring to FIG. 32, an implanting mask (not shown) having an opening partly exposing the top surface ST of the stack 53 is formed through photolithography. A location exposed by the opening undergoes Si-ion implantation. This forms the n-type barrier layer 12D that is an impurity-implanted layer. An implantation condition includes, for instance, a tilt angle of about seven degrees, an implantation energy level of about 20 keV to 200 keV, and an implantation dose of about $1 \times 10^{14}$ cm$^{-2}$ to $1 \times 10^{15}$ cm$^{-2}$. It is noted that a plurality of times of implantation may be performed along with different levels of energy in order to establish a flat impurity profile. Subsequently, heating for activation is performed at a temperature of about 1100° C. Accordingly, the conductivity type of an implanted region becomes an n-type. This forms the n-type barrier layer 12D without a potential barrier between the n-type epitaxial layer 7D and the n-type barrier layer 12D. It is noted that, if the donor concentration of the n-type barrier layer 12D is excessively higher than the acceptor concentration of the p-type epitaxial layer 9D, a depletion layer cannot extend in the n-type barrier layer 12D, thereby possibly reducing the withstand voltage. Hence, strict design of the opening width of the implantation mask and strict design of the doping concentration are required.

Figure 33:
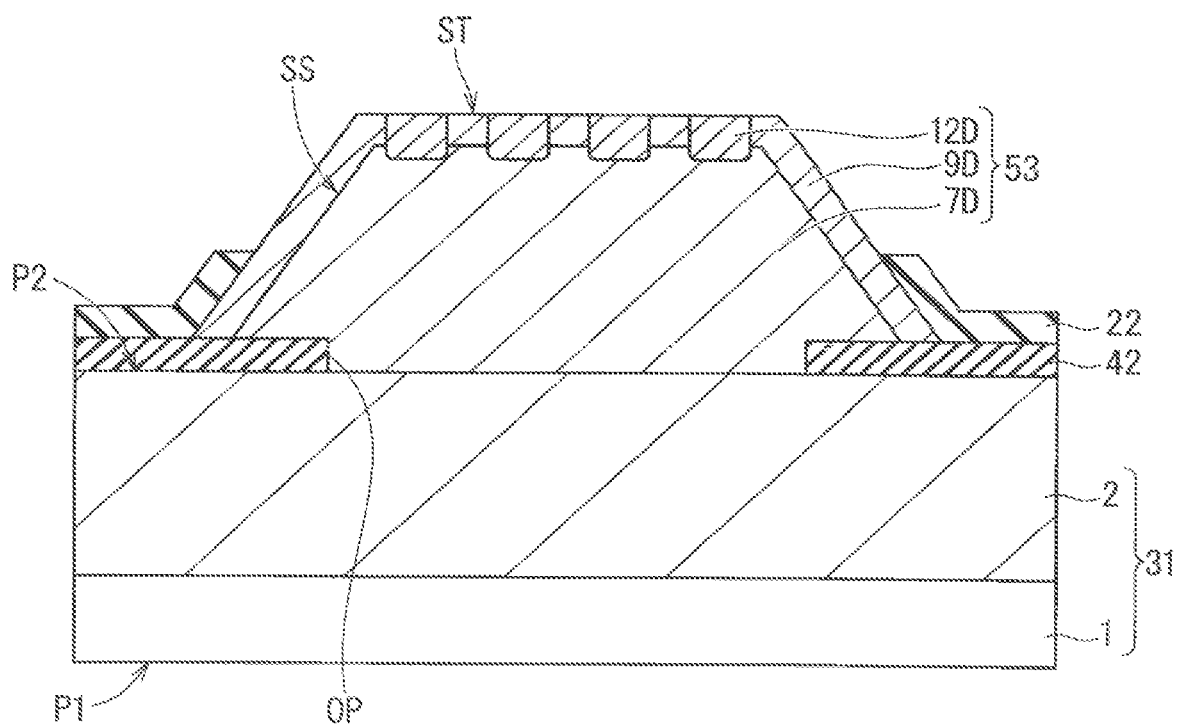
FIG. 33 is a schematic cross-sectional view of a fifth step in the method for manufacturing the semiconductor device in FIG. 27.

Referring to FIG. 33, a resist mask (not shown) is formed through photolithography. An opening is next formed in the insulating film 22 through wet-etching with an etchant, such as a buffered hydrofluoric acid.

Figure 34:
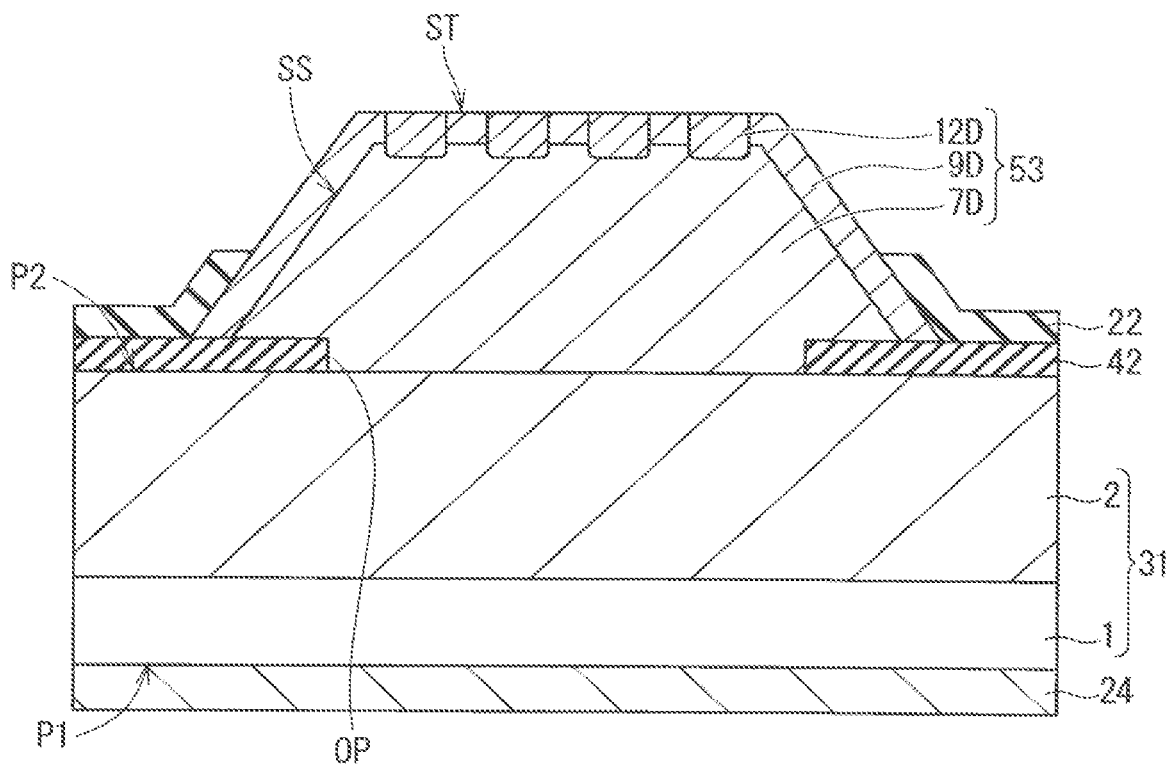
FIG. 34 is a schematic cross-sectional view of a sixth step in the method for manufacturing the semiconductor device in FIG. 27.

Referring to FIG. 34, the cathode electrode 24 is subsequently formed on the lower surface P1 of the epitaxial substrate 31. The cathode electrode 24 is formed of a stacked film made of materials, such as Ti, Al, Pt, Nb, Mo, Pd, In, and Au. After the cathode electrode 24 is formed, heating at a temperature of about 750° C. is performed for establishing an ohmic junction.

Referring to FIG. 35, the anode electrode 25 is subsequently formed through, for instance, a lift-off process. The anode electrode 25 can be formed of a stacked film made of materials, such as Ni, Ti, Al, Pt, Nb, Mo, Pd, In, and Au. After the film-formation for the anode electrode 25, an unnecessary portion is removed through lift-off. Through the processes described above, the diode 93 (FIG. 28) is obtained.

According to the present embodiment, the depletion layer extends not only from the pn junction formed on the top surface ST of the stack 53 having a mesa shape, but also from the pn junction formed on the side wall SS. Consequently, the strength of the electric field at the Schottky interface is further lessened. This enhances the reverse withstand voltage.

The mesa shape, having the inclined side wall SS, is formed through selective growth without a processing step, such as polishing or dry-etching. This avoids the inactivation of p-type GaN due to the processing step.

Fourth Embodiment

Summary

Figure 36:
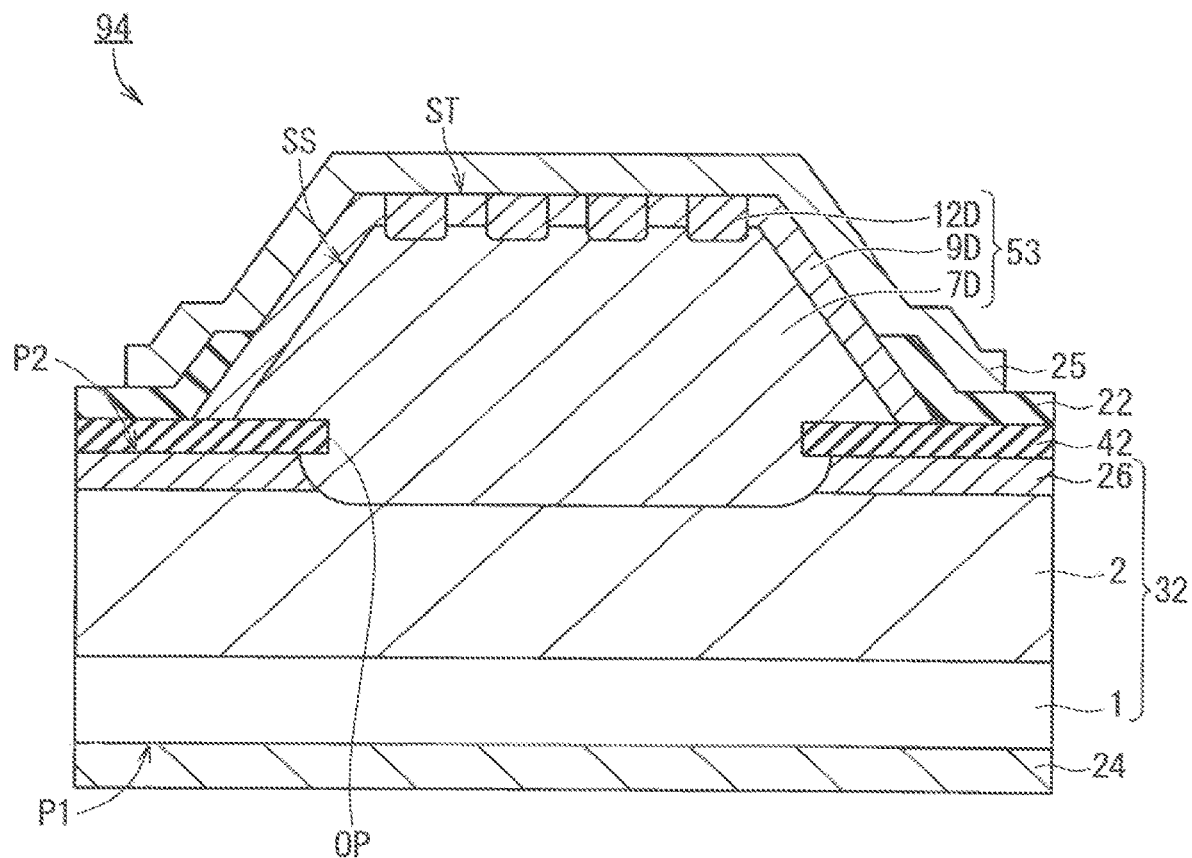
FIG. 36 is a schematic cross-sectional view of a configuration of a semiconductor device in a fourth embodiment of the present invention.

FIG. 36 is a schematic cross-sectional view of a configuration of a semiconductor device (diode) 94 according to a fourth embodiment.

The semiconductor device 94 includes a semiconductor substrate (epitaxial substrate) 32. The semiconductor substrate 32 includes an n-type region (n-type epitaxial portion) 2 and a p-type region (p-type epitaxial portion) 26. The n-type region 2 is exposed by an opening OP of an insulating layer 42. The p-type region 26 is disposed between the insulating layer 42 and the n-type region 2, and is in contact with an n-type epitaxial layer 7D.

Figure 37:
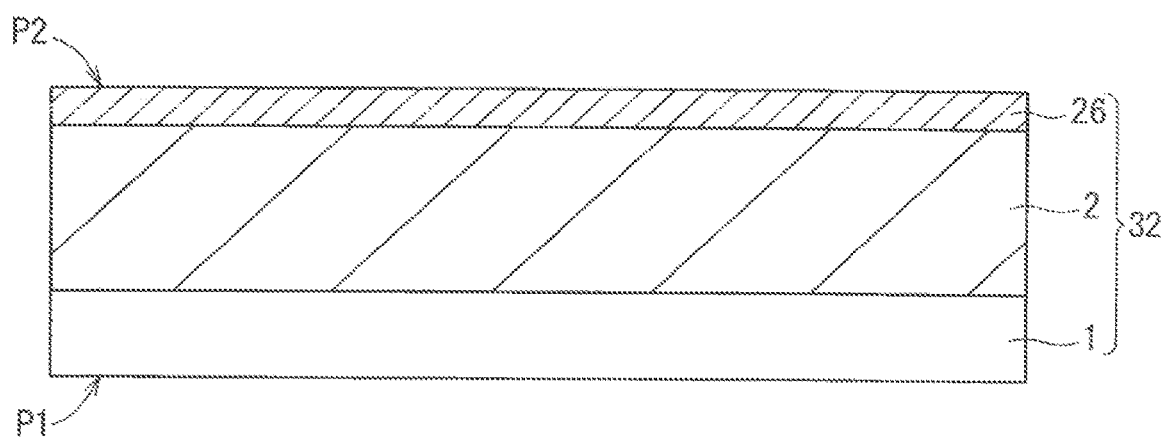
FIG. 37 is a schematic cross-sectional view of a first step in a method for manufacturing the semiconductor device in FIG. 36.
Figure 38:
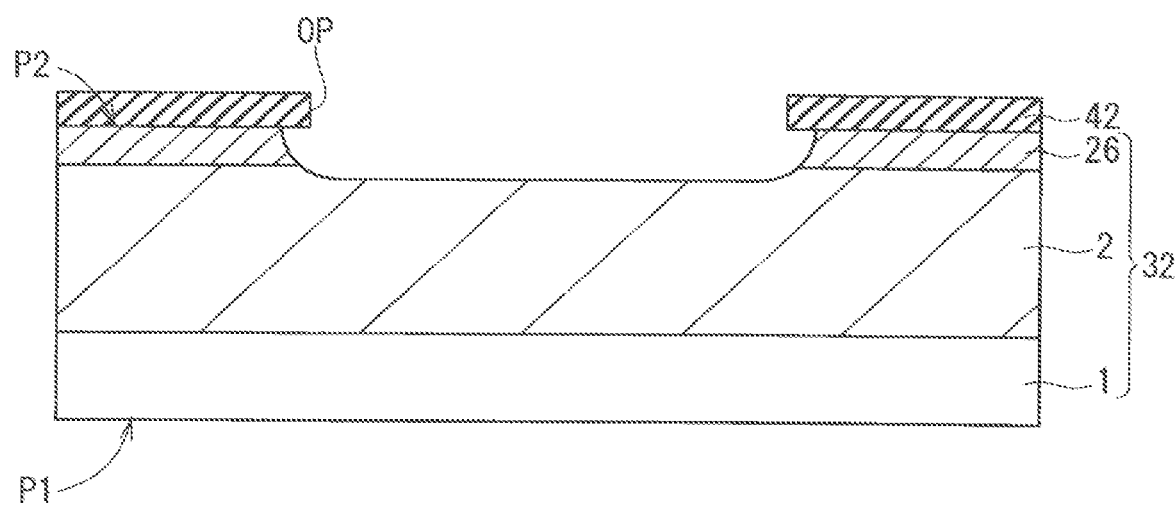
FIG. 38 is a schematic cross-sectional view of a second step in the method for manufacturing the semiconductor device in FIG. 36.

Referring to FIG. 37, in a method for manufacturing the semiconductor device 94, the semiconductor substrate 32, which includes the n-type region 2 and the p-type region 26 disposed on the n-type region 2 and constituting a second surface P2, is prepared in correspondence with the aforementioned configuration. Referring to FIG. 38, the p-type region 26 is removed in the opening OP of the insulating layer 42 by partly etching the p-type region 26 using the insulating layer 42 as an etching mask.

According to the present embodiment, a depletion layer extending from the p-type region 26 lessens an electric field at the lower end of a side wall SS of a stack 53. This enhances the reverse withstand voltage of the semiconductor device 94.

Details

Although overlapping the foregoing, the following describes the MOSFET 94 in a more concrete manner. It is noted that the following specific materials, specific impurity concentrations, and specific manufacture conditions are preferable examples, and thus do not exclude any other aspects.

Referring to FIG. 36, the diode 94 includes the epitaxial substrate 32 instead of the epitaxial substrate 31. The epitaxial substrate 32 includes the p-type epitaxial portion 26, which is disposed on the n-type epitaxial portion 2, in addition to an n-type monocrystal substrate 1 and the n-type epitaxial portion 2 that are similar to those in the third embodiment. The p-type epitaxial portion 26 is made of a GaN-based material, and is specifically a p-type GaN epitaxial layer. The p-type epitaxial portion 26 is disposed between the n-type epitaxial portion 2 and the insulating layer 42. In other words, the p-type epitaxial portion 26 is provided with an opening corresponding to the opening OP of the insulating layer 42. The n-type epitaxial layer 7D is directly disposed on the n-type epitaxial portion 2 through the opening. The n-type epitaxial layer 7D is in contact with the opening of the p-type epitaxial portion 26.

It is noted that configurations other than those described above are almost the same as those in the third embodiment, and that the same or corresponding components are denoted by the same symbols and will not be thus elaborated upon here.

The following describes a method for manufacturing the diode 94.

Referring to FIG. 37, the epitaxial substrate 32 is firstly formed. In the step forming the epitaxial substrate 32, the p-type epitaxial portion 26 is consecutively grown after the n-type epitaxial portion 2 is grown in the step of forming the epitaxial substrate 31 (FIG. 28: the third embodiment). This forms the epitaxial substrate 32 having a lower surface P1 that is formed of the n-type monocrystal substrate 1, and an upper surface P2 that is formed of the p-type epitaxial portion 26.

Referring to FIG. 38, the insulating layer 42 with the opening OP is subsequently formed on the upper surface P2 in a manner that is almost similar to the step in FIG. 29 in the third embodiment. Next, the p-type epitaxial portion 26 is partly etched through wet-etching using the insulating layer 42 as an etching mask. Accordingly, the n-type epitaxial portion 2 is exposed in the opening OP. A KOH solution can be used as an etchant in the wet-etching. Then, the diode 94 (FIG. 36) is obtained after steps that are almost similar to those in FIGS. 30 to 35 in the third embodiment.

According to the present embodiment, at the edge of the stack 53, which is a semiconductor region having a mesa shape, the p-type epitaxial portion 26 is provided. A depletion layer that extends from a pn junction established by the p-type epitaxial portion 26 lessens the concentration of an electric field. Consequently, the diode 94 further enhances reverse withstand voltage than the diode 93 (FIG. 28: the third embodiment).

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

Explanation of Reference Signs

P1 lower surface (first surface), P2 upper surface (second surface), SI inner side wall, OP opening, SO outer side wall, SS side wall, ST top surface, 1 n-type monocrystal substrate, 2 n-type epitaxial portion (n-type region), 3 first insulating film, 4 second insulating film, 5 bottom n-type epitaxial layer, 6 second insulating layer, 7 side n-type epitaxial layer, 7D n-type epitaxial layer, 8 first p-type epitaxial layer, 9 second p-type epitaxial layer, 9D p-type epitaxial layer, 10 filling layer, 11, 13, 22 insulating film, 12 n-type contact layer, 12D n-type barrier layer, 14 source electrode portion, 15 drain electrode, 16 gate insulating film, 17 metal pattern portion, 18 plating portion, 19 interlayer insulating film, 20 cover electrode layer, 21 MOS minimum unit, 24 cathode electrode, 25 anode electrode, 26 p-type epitaxial portion (p-type region), 31, 32 epitaxial substrate (semiconductor substrate), 41 first insulating layer, 42 insulating layer, 51, 53 stack, 61 gate electrode, 91, 91M, 92 MOSFET (semiconductor device), 93, 94 diode (semiconductor device).

The invention claimed is:

1. A semiconductor device comprising:
    a semiconductor substrate comprising a first surface and a second surface opposite the first surface;
    a first insulating layer disposed on the second surface of the semiconductor substrate, and comprising an opening partly exposing the second surface;
    a second insulating layer disposed above the second surface of the semiconductor substrate, with the second insulating layer being within the opening, and separated from the first insulating layer;
    a stack comprising, in sequence on the second surface of the semiconductor substrate, a side n-type epitaxial layer, a first p-type epitaxial layer having a first impurity concentration, and a second p-type epitaxial layer having an impurity concentration higher than the first impurity concentration, the side n-type epitaxial layer, the first p-type epitaxial layer, and the second p-type epitaxial layer being made of a gallium-nitride-based material, the stack comprising an outer side wall, an inner side wall, and a top surface joining the outer side wall and the inner side wall together, the outer side wall having a portion that is formed of the second p-type epitaxial layer, extending from the first insulating layer, and forming a smaller angle than a right angle together with the second surface of the semiconductor substrate, the inner side wall having a portion that is formed of the first p-type epitaxial layer, and extending from the second insulating layer, the stack comprising an n-type contact layer, the n-type contact layer constituting the top surface of the stack, and being in contact with the first p-type epitaxial layer;

a source electrode portion being in contact with the n-type contact layer on the top surface of the stack, and being in contact with the second p-type epitaxial layer on the outer side wall of the stack;

a drain electrode disposed on the first surface;

a gate insulating film disposed on the inner side wall of the stack; and a gate electrode disposed on the gate insulating film.

2. The semiconductor device according to claim 1, further comprising a bottom n-type epitaxial layer disposed on the second surface of the semiconductor substrate, and made of a gallium-nitride-based material, wherein the second insulating layer is disposed on the second surface of the semiconductor substrate with the bottom n-type epitaxial layer interposed therebetween, and wherein the stack is disposed on the second surface of the semiconductor substrate with the bottom n-type epitaxial layer interposed therebetween.

3. The semiconductor device according to claim 1, further comprising:

an interlayer insulating film disposed on the gate insulating film; and a cover electrode layer disposed on the source electrode portion and the interlayer insulating film, wherein the interlayer insulating film and the gate insulating film do not contain hydrogen.

4. The semiconductor device according to claim 1, wherein the gate insulating film is disposed on the second insulating layer.

5. The semiconductor device according to claim 1, wherein the gate insulating film comprises at least one of an $Al_2O_3$ film and a $SiO_2$ film.

* * * * *